(12) United States Patent  (10) Patent No.: US 7,663,915 B2
Kato  (45) Date of Patent: Feb. 16, 2010

(54) NONVOLATILE MEMORY

(75) Inventor: Kiyoshi Kato, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 300 days.

(21) Appl. No.: 10/588,064

(22) PCT Filed: Feb. 4, 2005

(86) PCT No.: PCT/JP2005/002108

§ 371 (c)(1),
(2), (4) Date: Aug. 1, 2006

(87) PCT Pub. No.: WO2005/076281

PCT Pub. Date: Aug. 18, 2005

(65) Prior Publication Data

US 2008/0144374 A1   Jun. 19, 2008

(30) Foreign Application Priority Data

Feb. 10, 2004 (JP) ............................. 2004-033075
Feb. 10, 2004 (JP) ............................. 2004-033081

(51) Int. Cl.
*G11C 16/04* (2006.01)
(52) U.S. Cl. .................... 365/185.05; 365/82; 365/131
(58) Field of Classification Search ............ 365/185.05, 365/82, 131, 185.03
See application file for complete search history.

(56) References Cited

U.S. PATENT DOCUMENTS

| 4,167,786 | A | * | 9/1979 | Miller et al. ................. 700/295 |
| 4,596,014 | A | * | 6/1986 | Holeman ..................... 714/805 |
| 4,768,169 | A | * | 8/1988 | Perlegos ....................... 365/200 |
| 4,807,188 | A | * | 2/1989 | Casagrande ............. 365/185.05 |
| 4,970,691 | A | * | 11/1990 | Atsumi et al. .......... 365/189.11 |
| 5,029,131 | A | * | 7/1991 | Vancu .................... 365/185.03 |
| 5,243,569 | A | | 9/1993 | Atsumi |
| 5,323,347 | A | * | 6/1994 | Machida ................. 365/189.02 |
| 5,379,415 | A | * | 1/1995 | Papenberg et al. ............. 714/5 |

(Continued)

FOREIGN PATENT DOCUMENTS

EP  0 293 339  11/1988

(Continued)

OTHER PUBLICATIONS

European Search Report (Application No. 05710153.7) dated May 3, 2007.

(Continued)

*Primary Examiner*—Huan Hoang
(74) *Attorney, Agent, or Firm*—Eric J. Robinson; Robinson Intellectual Property Law Office, P.C.

(57) ABSTRACT

A memory cell for storing 1-bit data is formed by using at least two memory elements in the OTP type nonvolatile memory using a memory element that have two states and can transit only in one direction. In the OTP type nonvolatile memory using a memory element that has two states of an H state (a first state) and an L (a second state) state (hereinafter simply referred to as H and L) and can electrically transit only in one direction from L to H, a memory cell for storing 1-bit data is formed by using two or more memory elements.

11 Claims, 23 Drawing Sheets

U.S. PATENT DOCUMENTS

| | | | |
|---|---|---|---|
| 5,467,396 A * | 11/1995 | Schossow et al. | 713/193 |
| 5,528,553 A * | 6/1996 | Saxena | 365/230.01 |
| 5,535,162 A * | 7/1996 | Uenoyama | 365/200 |
| 5,901,156 A * | 5/1999 | Botzenhardt et al. | 714/748 |
| 5,999,447 A * | 12/1999 | Naura et al. | 365/185.04 |
| 6,047,302 A * | 4/2000 | Kanie | 708/402 |
| 6,076,149 A | 6/2000 | Usami et al. | |
| 6,141,257 A * | 10/2000 | Rochard | 365/189.05 |
| 6,160,734 A * | 12/2000 | Henderson et al. | 365/185.04 |
| 6,182,239 B1 * | 1/2001 | Kramer | 714/5 |
| 6,256,702 B1 * | 7/2001 | Yoneyama | 711/103 |
| 6,388,503 B1 * | 5/2002 | Maloney | 327/384 |
| 6,469,928 B2 | 10/2002 | Takata | |
| 6,490,197 B1 | 12/2002 | Fasoli | |
| 6,646,922 B2 | 11/2003 | Kato | |
| 6,757,832 B1 * | 6/2004 | Silverbrook et al. | 713/194 |
| 6,794,997 B2 * | 9/2004 | Sprouse | 341/50 |
| 6,947,327 B2 | 9/2005 | Kato | |
| 7,093,139 B2 * | 8/2006 | Silverbrook et al. | 713/194 |
| 7,142,452 B1 * | 11/2006 | Tiwari | 365/185.04 |
| 7,178,067 B2 * | 2/2007 | Wuidart, Sylvie | 714/42 |
| 7,188,282 B2 * | 3/2007 | Walmsley | 714/718 |
| 7,310,256 B2 * | 12/2007 | Takemura et al. | 365/63 |
| 7,360,131 B2 * | 4/2008 | Walmsley | 714/718 |
| 7,362,622 B2 * | 4/2008 | Braun et al. | 365/189.09 |
| 7,411,837 B2 * | 8/2008 | Deppe et al. | 365/185.28 |
| 2001/0036105 A1 | 11/2001 | Takata | |
| 2002/0131299 A1 | 9/2002 | Yamazoe et al. | |
| 2005/0281126 A1 | 12/2005 | Kato | |
| 2008/0144374 A1 * | 6/2008 | Kato | 365/185.05 |

FOREIGN PATENT DOCUMENTS

| | | |
|---|---|---|
| EP | 0 337 393 | 10/1989 |
| EP | 0 448 118 | 9/1991 |
| EP | 1 143 455 | 10/2001 |
| EP | 1 282 135 | 2/2003 |
| JP | 10-116493 | 5/1998 |
| JP | 10-154293 | 6/1998 |
| JP | 10-228422 | 8/1998 |
| JP | 2000-207506 | 7/2000 |
| JP | 2001-283594 | 10/2001 |
| JP | 2002-203217 | 7/2002 |
| JP | 2002-251888 | 9/2002 |
| JP | 2002-316724 | 10/2002 |
| JP | 2003-051196 | 2/2003 |
| JP | 2003-132690 | 5/2003 |

OTHER PUBLICATIONS

International Search Report (Application No. PCT/JP2005/002108) Dated Jun. 21, 2005.
Written Opinion (Application No. PCT/JP2005/002108) Dated Jun. 21, 2005.
Search Report (Application No. 05710153.7) Dated Aug. 31, 2007.

* cited by examiner

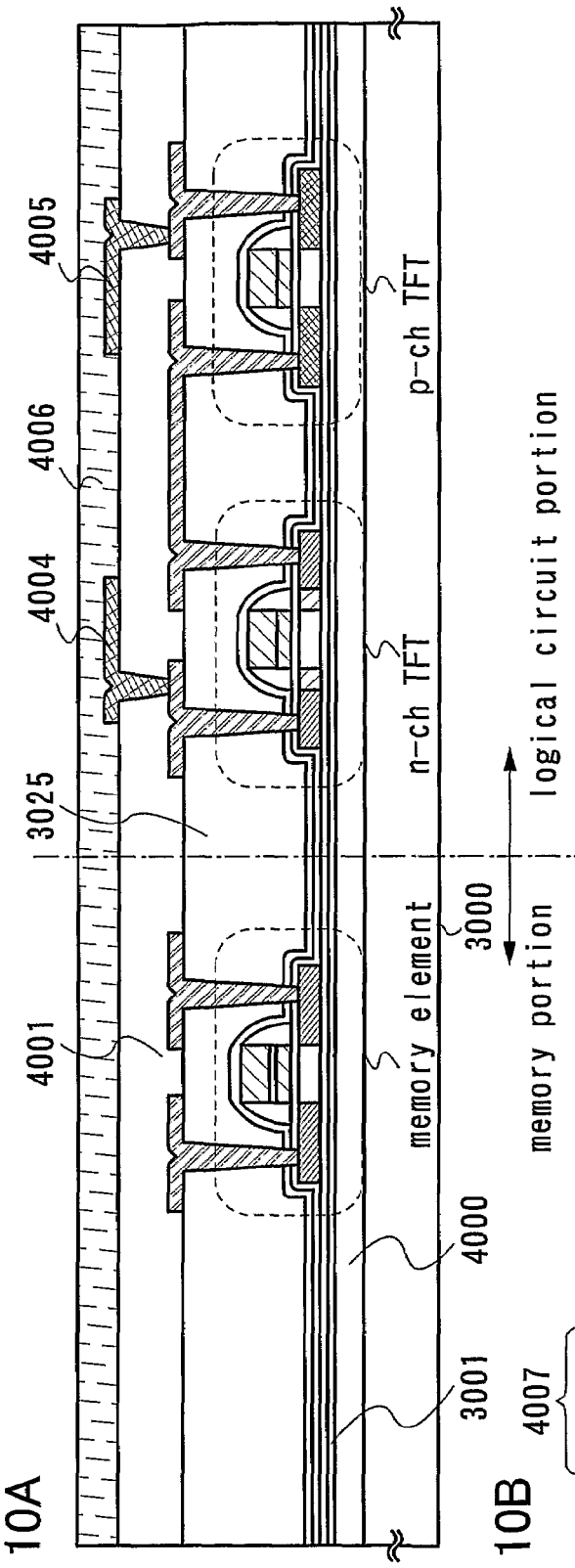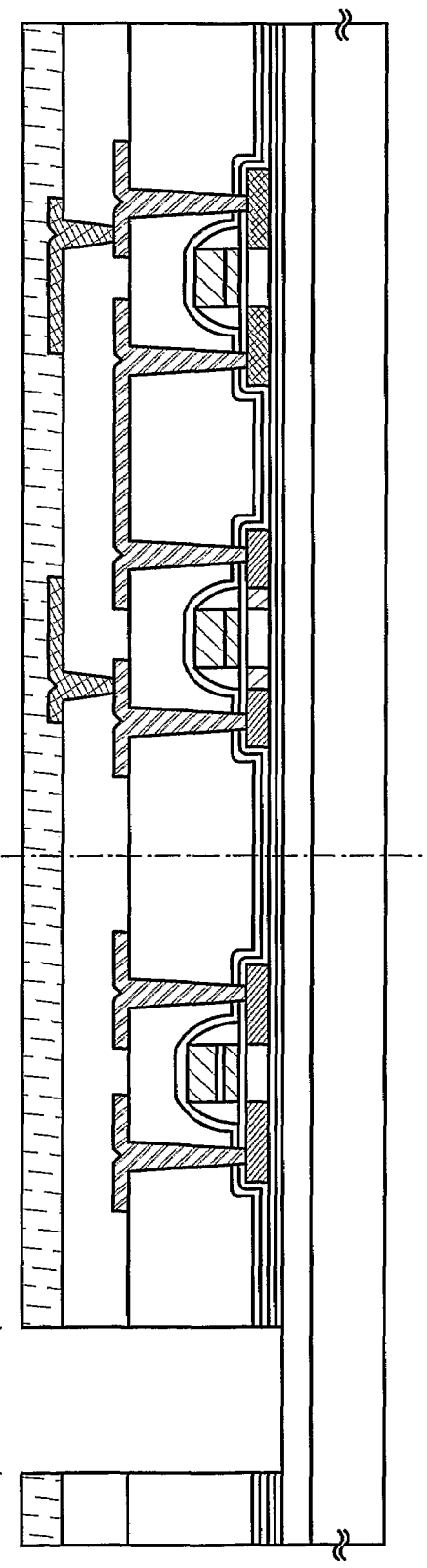
FIG. 10A
FIG. 10B

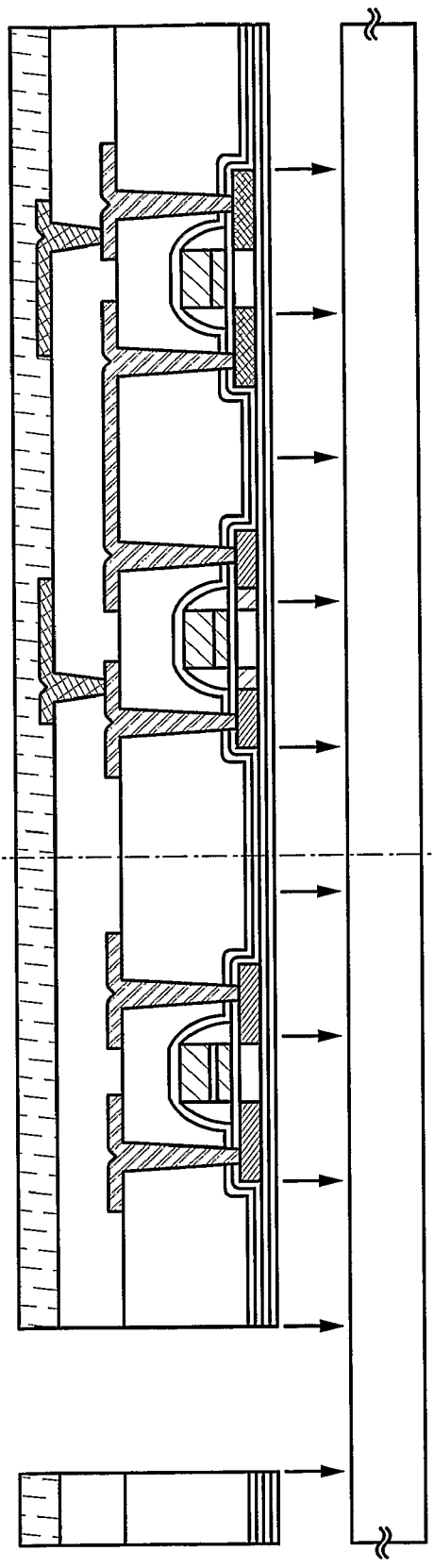
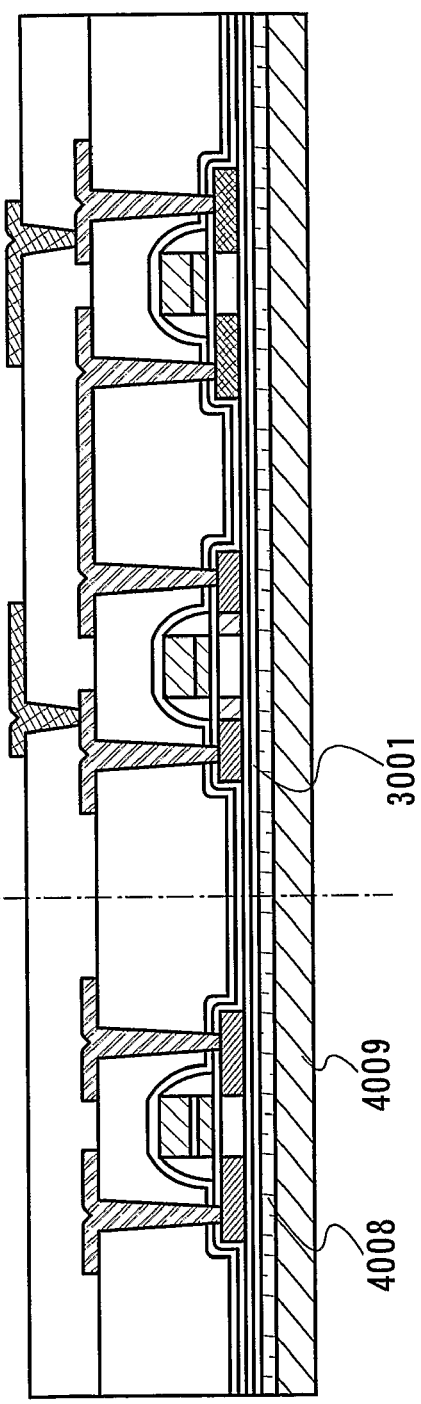
FIG. 11A
FIG. 11B bending direction direction of carriers move

NONVOLATILE MEMORY

TECHNICAL FIELD

The present invention relates to a nonvolatile memory. In particular, the invention relates to a nonvolatile memory to which data can be written only once.

BACKGROUND ART

Memories are briefly categorized into volatile memories such as an SRAM (Static Random Access Memory) and a DRAM (Dynamic Random Access Memory) and nonvolatile memories such as an EEPROM (Electrically Erasable Programmable Read Only Memory) and a flash EEPROM. A volatile memory has a disadvantage in that data is lost once the power source is turned OFF. On the other hand, a nonvolatile memory in which data is not lost even when the power source is turned OFF, is used for a program for running a system and the like.

In recent years, a nonvolatile memory used for an IC card is attracting attentions. A magnetic card that is presently used can be easily reprogrammed in data, which means it is low in security. Accordingly, an IC card is expected to be used as a medium substituting a magnetic card and to be applied to electronic money or resident cards. In particular, its function regarding the security of data is emphasized in order to avoid forgery and abuse.

Nonvolatile memories using semiconductors are categorized into a rewritable type using a memory element of a floating gate structure, a ferroelectric element, or a memory element that exhibits magneto resistance and phase change, and a non-rewritable type such as a mask ROM. Besides, there is another rewritable type which can be written only once, using a memory element of a floating gate structure and a memory element that exhibits phase change (hereinafter also referred to as an OTP (One-Time Programmable)) (see Patent Document 1).

[Patent Document 1]
Japanese Patent Laid-Open No. 2003-51196

DISCLOSURE OF INVENTION

A conventional OTP type nonvolatile memory that can be written only once and thus the data is not likely to be tampered with is considered to be high in security. For example, once data is written to an OTP type nonvolatile memory using a memory element of a floating gate structure, the data cannot be erased unless ultraviolet ray is irradiated. Therefore, an OTP type nonvolatile memory that is sealed cannot be erased in data unless the package is broken. However, it is electrically possible to write data additionally, which could change data.

In view of the aforementioned problems, one subject of the invention is to provide an OTP type nonvolatile memory in which data cannot be electrically changed thus is high in security.

In order to solve the aforementioned problems, the invention provides a plurality of memory elements for storing 1-bit data for an OTP type nonvolatile memory using a memory element that has two states and is capable of electrically transiting in only one direction.

That is, two or more memory elements are used for storing 1-bit data in an OTP type nonvolatile memory using a memory element that has two states of an H state and an L state (hereinafter also simply referred to as H and L) and is capable of electrically transiting in only one direction from L to H.

In specific, in the case of using two memory elements for storing 1-bit data, assuming that states of the two memory element are (L, L), (H, L), (L, H), and (H, H), the state (H, L) corresponds to "1" while the state (L, H) corresponds to "0". It is needless to say that the relationship between these may be opposite.

The states of the two memory elements are either a state that transits from (L, L) to (H, L) and then to (H, H), or a state that transits from (L, L) to (L, H) and then to (H, H). Note that (H, L) and (L, H) cannot be transited to each other.

In a memory cell formed of n memory elements (n is an integer of 3 or larger) which cannot be transited to each other, a pair of the states that k memory elements are in the L state (k is an integer from 1 to n) while (n–k) memory elements are in the H state can be considered. Assuming that n=5 and k=4 are satisfied in such a state, there are five states of (H, L, L, L, L), (L, H, L, L, L), (L, L, H, L, L), (L, L, L, H, L), and (L, L, L, L, H). It is clear that in these states, transition using electrical writing from the L state to the H state is impossible.

By storing data using such a plurality of states, for example, a nonvolatile memory in which data once written cannot be changed to other data can be realized.

In the case where the state that does not correspond to the data is read out when reading out this memory, the data can be invalidated as an invalid additional writing. In this manner, for example, an OTP type nonvolatile memory that is high in security can be obtained. More specifically, the invention employs the following structure.

According to the invention, a memory cell is formed by using as one unit at least two memory cells that can transit only from the first state to the second state that are different in electronic characteristics by applying at least a voltage or a current. The invention provides a nonvolatile memory that can store data by using only a state that a certain number of the memory cells are transited from the first state to the second state.

The invention is formed by using as one unit at least two memory cells that can transit only from the first state to the second state that are different in electronic characteristics by applying at least a voltage or a current. The invention provides a nonvolatile memory that can store data by using only a state that cannot be electrically transited to each other among combinations that can be obtained as the unit.

According to the aforementioned structure of the invention, the first state and the second state refer to a threshold voltage, an ON current value, a resistance value, a direction of magnetization, a direction of magnetic field of a transistor and the like. The invention provides an OTP type nonvolatile memory by utilizing a change in those states.

By using at least two memory elements and forming 1-bit data by using two states that the memory element can obtain, for example, a nonvolatile memory in which data once written cannot be reprogrammed can be provided. Thus, an OTP type nonvolatile memory that is high in security can be obtained.

BRIEF DESCRIPTION OF DRAWINGS

FIGS. 10A and 10B are diagrams showing transfer steps of a TFT to a flexible substrate according to the invention.

FIGS. 11A and 11B are diagrams showing transfer steps of a TFT to a flexible substrate according to the invention.

BEST MODE FOR CARRYING OUT THE INVENTION

Figure 1A:
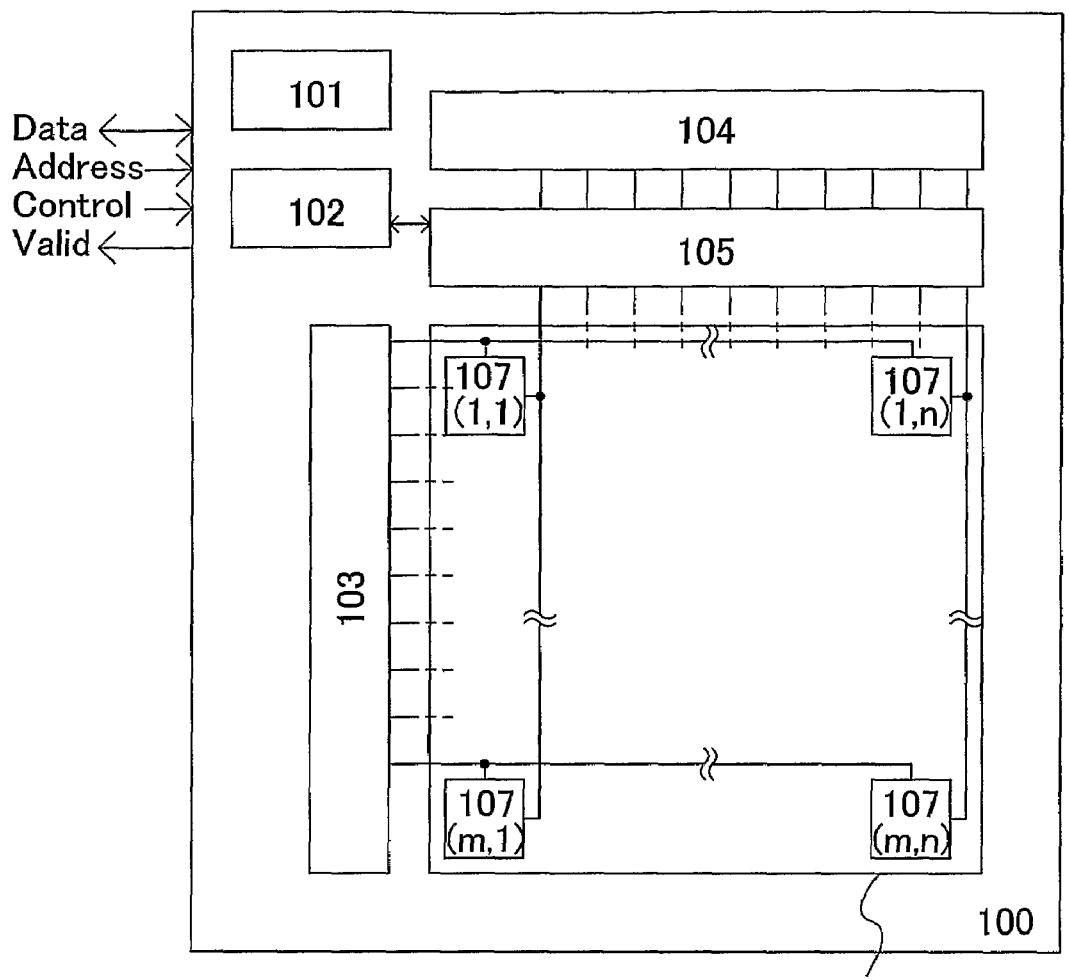
FIGS. 1A and 1B are block diagrams showing configurations of the nonvolatile memory of the invention.

Although Embodiment Mode 1 of the invention will be described with reference to accompanying drawings, it is to be understood that various changes and modifications will be apparent to those skilled in the art. Therefore, unless otherwise such changes and modifications depart from the scope of the present invention hereinafter defined, they should be constructed as being included therein. In the drawings, the same portions or portions having similar functions are denoted by the same reference numerals and the description on them will not be repeated.

Embodiment Mode 1

In this embodiment mode, in an OTP type nonvolatile memory formed of memory elements that have two states of L (a first state) and H (a second state) and can be transited only from L to H by applying at least a voltage or a current, a memory cell formed of two memory elements is a unit for storing 1-bit data. Hereinafter described is a mode that 1-bit data is stored by using a pair of the states in which one memory element is in the L state while the other is in the H state. Note that, the first state and the second state refer to a threshold voltage, an ON current value, a resistance value, a direction of magnetization, a direction of magnetic field of a transistor and the like.

In a circuit configuration of a memory cell array in the OTP type nonvolatile memory in this embodiment mode, the memory cell that stores data corresponds to n conventional memory cells. For example, assuming that data of i-bit (i is an integer from 1 to (n−1)) is stored in one memory cell, data has to be converted between input/output data of i-bit and internal data of n-bit that corresponds to the internal state of the memory cell. According to the invention, a signal representative of the reliability of data (hereinafter referred to as a valid signal or a signal for determining) is outputted, and it can be determined if the data read out is reliable or not by this signal.

A memory element of the OTP type nonvolatile memory can be used for the memory element as it is. That is, a memory element formed by a transistor having a floating gate is used and a transition of the states of the memory element is performed by a channel hot electron entering a floating gate. The H state or the L state can be determined by an existence of the channel hot electron in the floating gate. The channel hot electron that once entered in the floating gate cannot be electrically got rid of, therefore, transitions are all made in one direction from L to H.

A configuration example of the OTP type nonvolatile memory in this embodiment mode is described with reference to FIGS. 1A and 1B. The nonvolatile memory of the invention includes a write circuit 101, a read circuit 102, a row decoder 103, a column decoder 104, a selector 105, a memory cell array 106 and the like over a substrate 100 (see FIG. 1A). The memory cell array 106 includes m word lines, 2×n-bit lines, and m×n memory cells 107 arranged in matrix.

Figure 1B:
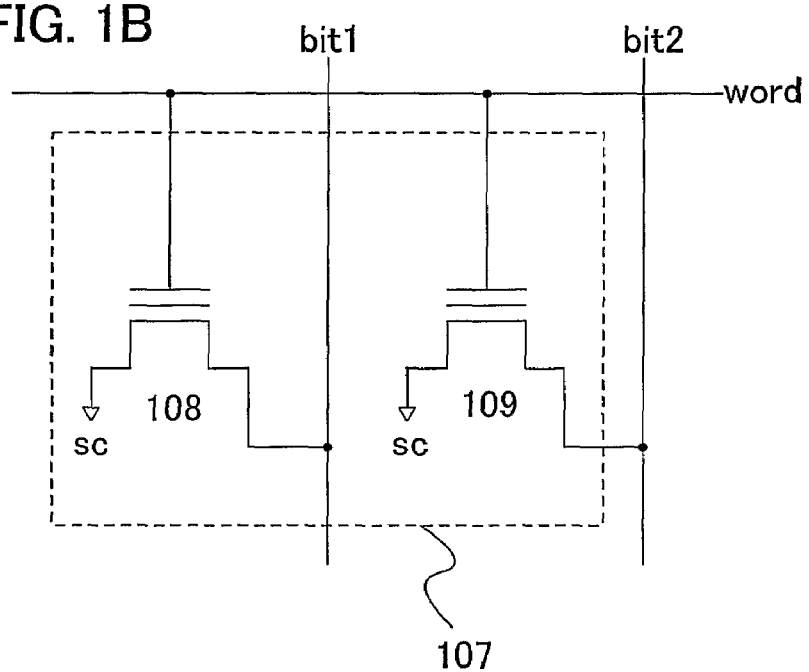

Each of the memory cells 107 includes a first memory element 108 and a second memory element 109 (see FIG. 1B). Each of the first memory element 108 and the second memory element 109 has a floating gate, a controlling gate, a source region and a drain region. Each controlling gate is connected to a common word line (denoted as "word" in the drawing). One of the source region and the drain region is connected to different bit lines (referred to as "bit1" and "bit2") while the other is connected to a common electrode (SC).

Data stored in the memory cells 107 are determined by states of the first memory element 108 and the second memory element 109. For example, it is assumed that the state of the memory cell 107, namely a state A of the first memory element 108 and a state B of the second memory element 109 are denoted as (A, B) and a state of (H, L) corresponds to data "1" (High) while a state of (L, H) corresponds to "0" (Low).

Writing to the memory cells 107 is performed when the memory cells are in a state of (L, L). When the memory receives a control signal (Control) representative of writing, a voltage required for the writing is selected, the write circuit 101 converts a data signal (Data) into (H, L) or (L, H) in an internal data form and send it to an internal data bus. At the same time, an address signal is inputted to the row decoder 103 and the column decoder 104 and a memory cell is selected. As a result, a high potential is applied to a word line connected to the selected memory cell while a high potential for writing corresponding to the internal data is applied to the bit line, thus a writing is performed.

When a high potential is applied to a bit line connected to the first memory element 108, a state of (H, L) is obtained. Thus, data of "1" is stored in the memory cell 107. When a high potential is applied to a bit line connected to the second memory element 109, a state of (L, H) is obtained. Thus, data of "0" is stored in the memory cell 107.

A nonvolatile memory of which write circuit is simplified is described with reference to FIG. 8. A circuit shown in FIG. 8 is a circuit that includes memory cells for 3-bit, to which input data is written.

Figure 8:
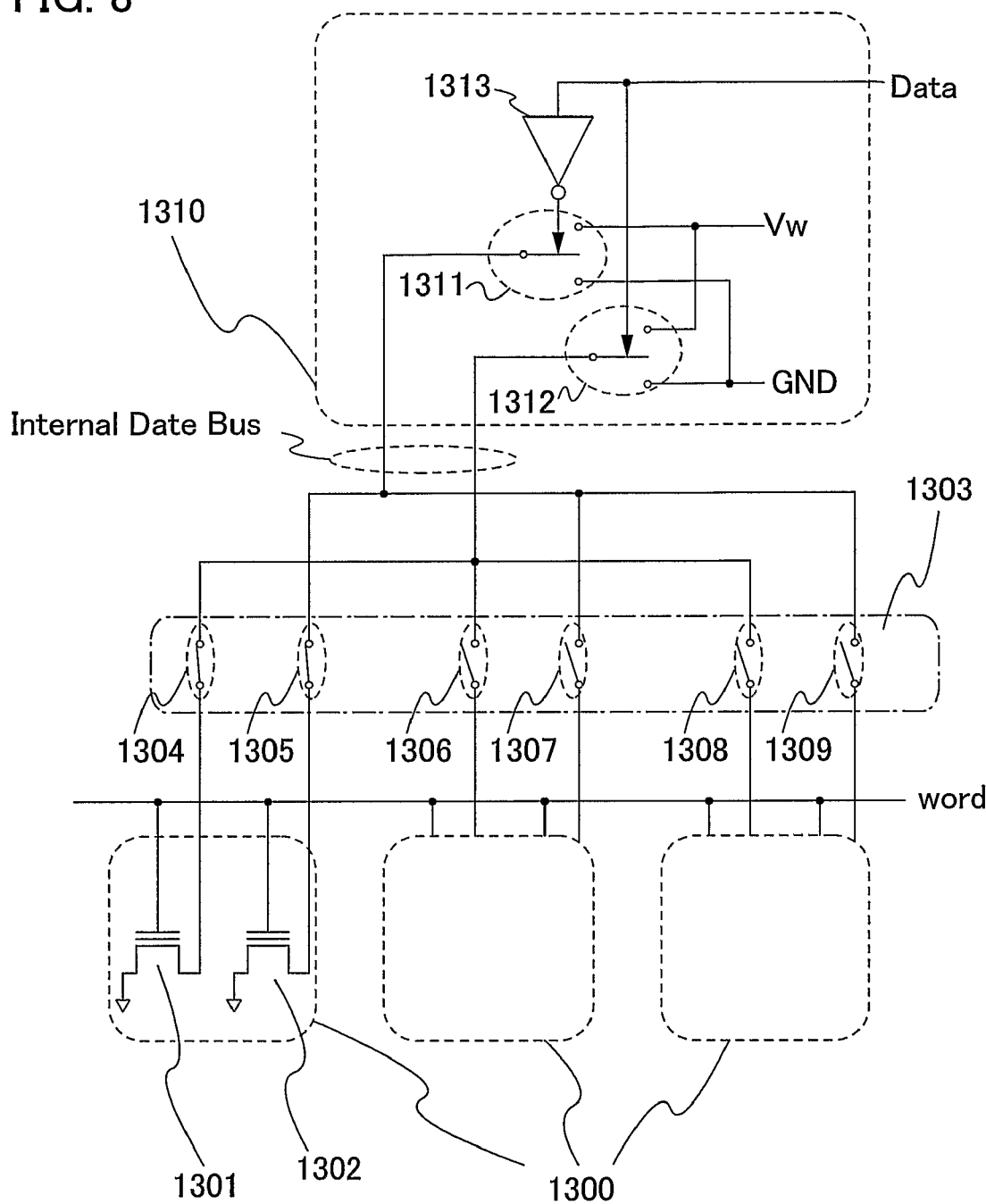
FIG. 8 is a diagram showing a write circuit of the nonvolatile memory of the invention.

A nonvolatile memory shown in FIG. 8 includes memory cells 1300, a selector 1303, and a write circuit 1310. The memory cells 1300 each includes a first memory element 1301 and a second memory element 1302, the selector 1303 includes switches 1304 to 1309, and the write circuit 1310 includes switches 1311 and 1312, and an inverter 1313.

This circuit can operate as follows. Input data is converted into internal data having two-digit by a write potential Vw or GND through the inverter 1313 and the switches 1311 and 1312 in the write circuit 1310. In specific, the circuit is driven so that two internal data buses are (Vw, GND) when the input data is "1". When the memory cell 1300 is selected by the selector 1303, the selected memory cell 1300 is written so as to be in a state of (H, L). Similarly, the circuit is driven so that the two internal data buses are (GND, Vw) when the input data is "0". Then, when the memory cell 1300 is selected by the selector 1303, the selected memory cell 1300 is written so as to be in a state of (L, H).

As described above, a transition of the states of the memory element is one direction from L to H. That is, a possible transition of the states is an order of from (L, L) to (H, L), then to (H, H). Otherwise, an order from (L, L) to (L, H), then to (H, H) is possible. One of these transitions can be accepted. Therefore, (H, L) and (L, H) cannot be transited to each other. As a result, data that once becomes "0" (state (L, H)) cannot be converted into "1" (state (H, L).

For example, when the memory cell 107 having data of "0" is written and the first memory element 108 is injected charge, a state of (H, H) is obtained, which is processed as invalid. The same applies to the case where the memory cell having data of "1" is written and the second memory element 109 is injected charge. In this manner, a nonvolatile memory that is high in security and data therein cannot easily be tampered with by an additional writing can be realized.

As for reading, when a memory receives a control signal (Control) representative of reading, a voltage required for the reading is selected and an address signal is inputted to the row decoder 103 and the column decoder 104 at the same time, and a memory cell to be read is selected. Then, a potential of a bit line connected to the selected memory cell is inputted to the read circuit 102. The read circuit 102 reads out and outputs data based on the potential of the bit line. At this time, it is also a feature of the invention to output a valid signal that determines if the read data is reliable or not.

Figure 3:
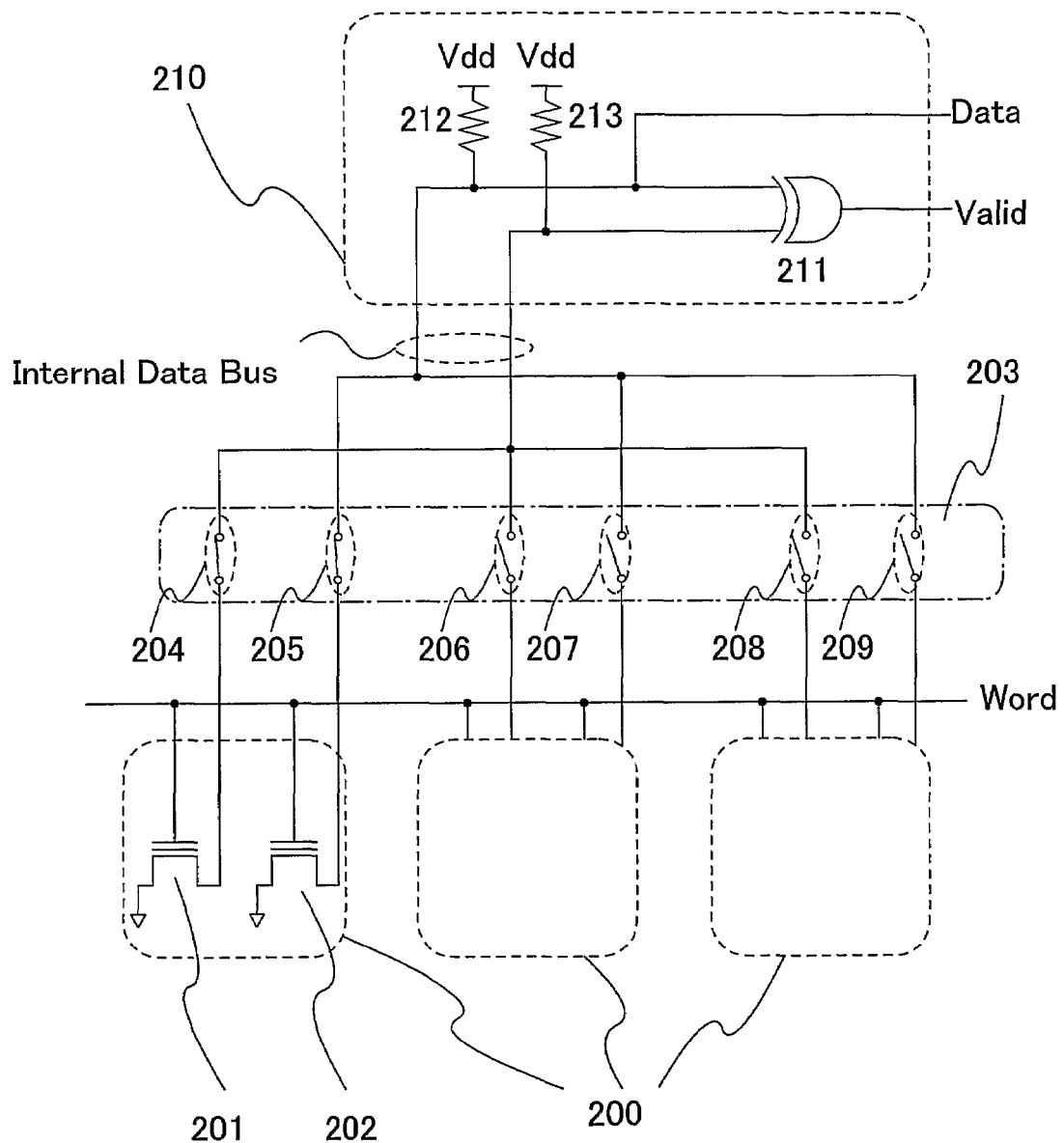
FIG. 3 is a diagram showing a read circuit of the nonvolatile memory of the invention.

An example of a simplified read circuit is described with reference to FIG. 3. FIG. 3 shows a circuit that includes memory cells for 3-bit and reads data stored therein.

A nonvolatile memory shown in FIG. 3 includes memory cells 200, a selector 203, and a read circuit 210. Each of the memory cells 200 includes a first memory element 201 and a second memory element 202, the selector 203 includes switches 204 to 209, and the read circuit 210 includes an exclusive disjunction (XOR) gate 211 and resistors 212 and 213. The resistors 212 and 213 are provided for controlling a voltage inputted to the XOR gate 211, therefore, other elements having a similar function may substitute them.

An operation of this circuit is described. The selector 203 selects a memory cell and turns ON a corresponding switch. Data is obtained by reading a state of the first memory element 201 as it is. Further, a valid signal is generated through an exclusive disjunction of the states of the first memory element 201 and the second memory element 202.

The valid signal is a signal that becomes "1" when the states of the first memory element 201 and the second memory element 202 become (H, L) or (L, H) through the XOR gate 211 and "0" when the states thereof become (L, L) or (H, H). That is, the valid signal is a signal that outputs "1" when the state of the memory cell that is read corresponds to data and "0" when it does not correspond to the data.

When the valid signal is "1", it is recognized that invalid data is written in the memory cell that has been read. On the other hand, when the valid signal is "0", it can be recognized that data is not stored in the memory cell. The valid signal "0" is outputted when reading a memory cell to which data is not yet written, a memory cell that has a data writing error, a memory cell to which an invalid additional writing is done and the like. In terms of security, such a measure as to invalidate the data of such a memory can be taken.

In terms of security, it is preferable to write data fully when writing, that is, to transit all the memory cells to be representative of the data. In that case, a valid signal becomes "1" all the time. Provided that the valid signal of "0" is outputted, an invalid additional writing and the like can be doubted, thus the reliability of data can be determined according to the valid signal. Accordingly, such a measure can be taken as to invalid the data of the memory cell that outputted "0".

Embodiment Mode 2

Figure 20A:
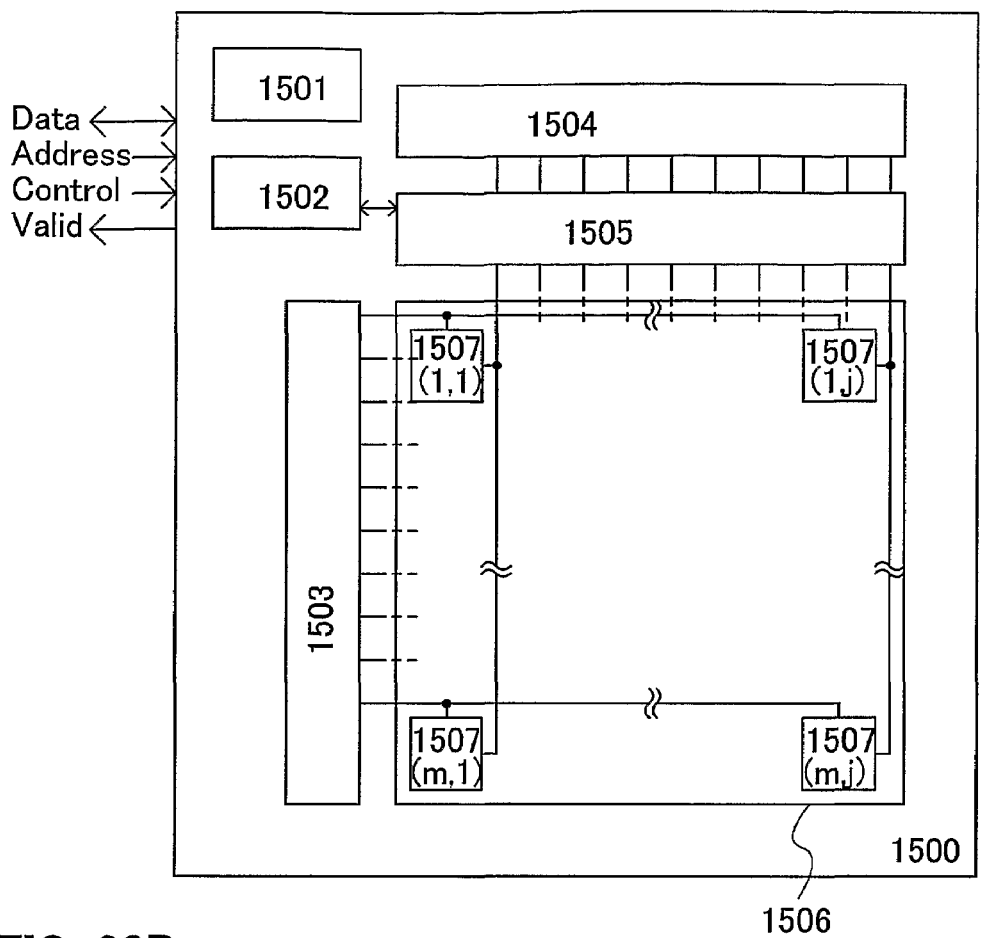
FIGS. 20A and 20B are block diagrams showing the nonvolatile memory of the invention.
Figure 20B:
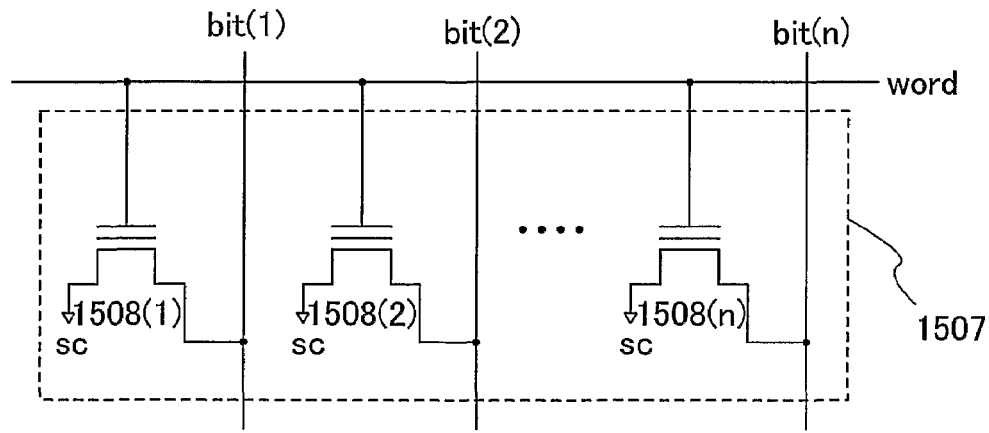
Figure 21:
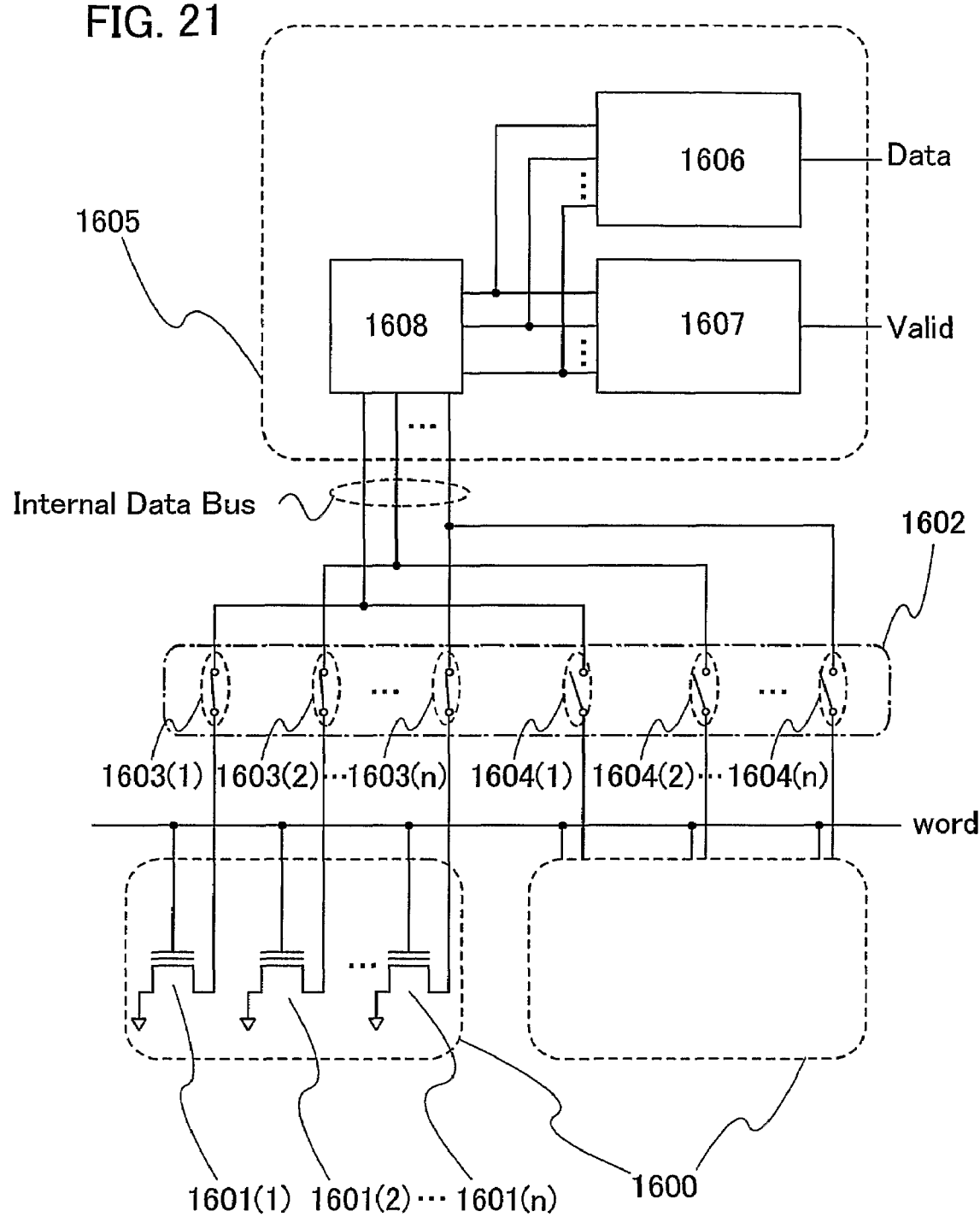
FIG. 21 is a diagram showing a read circuit of the nonvolatile memory of the invention.
Figure 22:
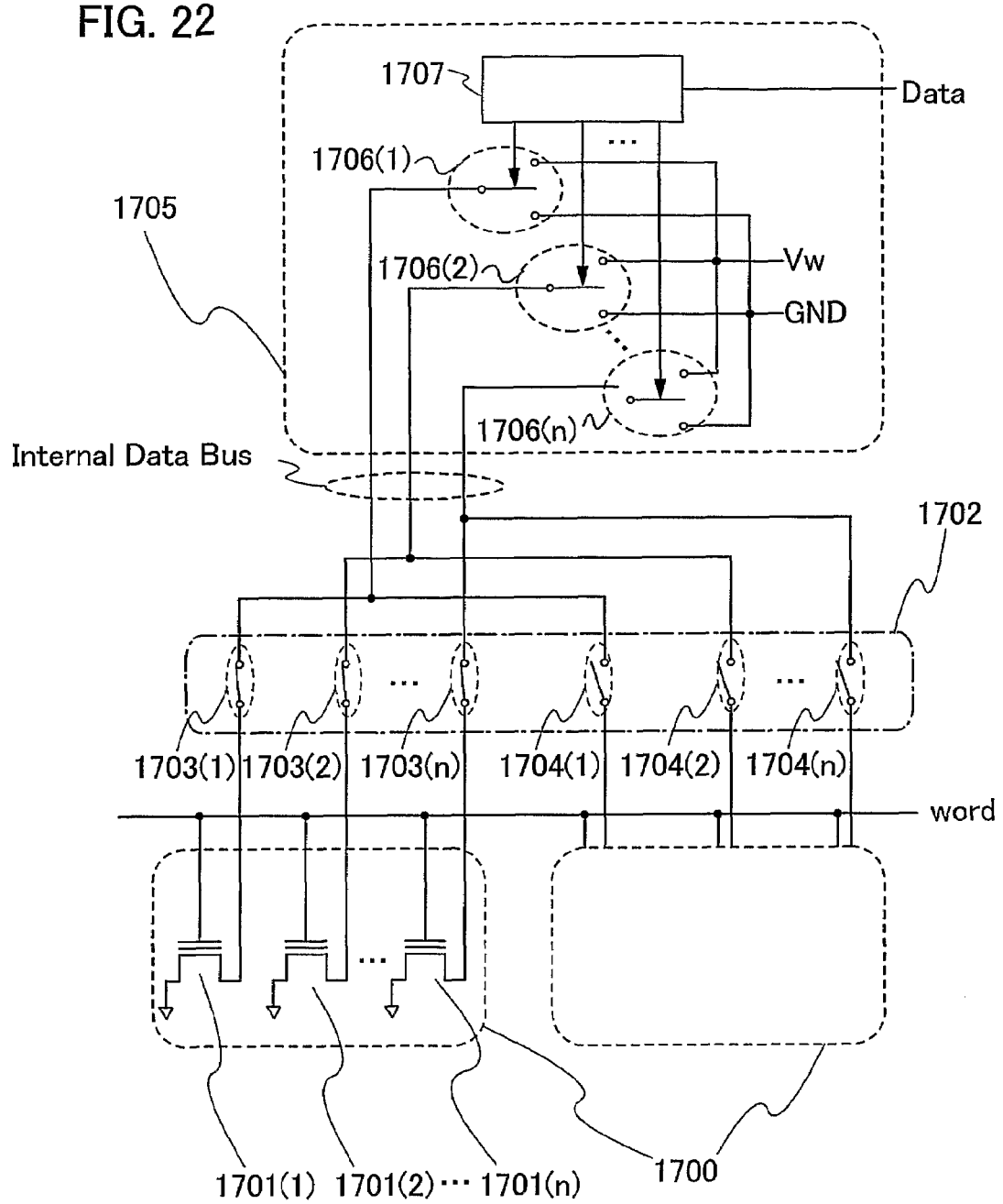
FIG. 22 is a diagram showing a write circuit of the nonvolatile memory of the invention.

In this embodiment mode, in an OTP type nonvolatile memory formed of a memory element that has two states of L (a first state) and H (a second state) and can be transited only from L to H by applying at least a voltage or a current, a description is made with reference to FIGS. 20 to 22 on the case where a memory cell formed of n (n is an integer of 3 or larger) memory elements is used as one unit for storing data, and data is stored by using a pair of the states that k (k is an integer from 1 to n) memory elements are in the L state and (n−k) memory elements are in the H state. Note that, the first state and the second state refer to a threshold voltage, an ON current value, a resistance value, a direction of magnetization, a direction of magnetic field of a transistor and the like.

In a circuit configuration of a memory cell array in the OTP type nonvolatile memory in this embodiment mode, the memory cell that stores data corresponds to n conventional memory cells. For example, assuming that i-bit (i is an integer from 1 to (n−1)) data is stored in one memory cell, data has to be converted between input/output data of i-bit and internal data of n-bit that corresponds to an internal state of the memory cell. According to the invention, a signal representative of the reliability of data (hereinafter referred to as a valid signal or a signal for determining) is outputted, and it can be determined if the data read out is reliable or not by this signal.

A memory element similar to a memory element of an OTP type nonvolatile memory can be used. The memory element is used as a transistor having a floating gate and a transition of the states of the memory element is performed by a channel hot electron entering a floating gate. The H state, or the L state can be determined by an existence of the channel hot electron in the floating gate. The channel hot electron that once entered in the floating gate cannot be electrically got rid of, therefore, transitions are all made in one direction from L to H.

A configuration of an OTP type nonvolatile memory of the invention is shown in FIG. 20A. The nonvolatile memory of the invention includes a write circuit 1501, a read circuit 1502, a row decoder 1503, a column decoder 1504, a selector 1505, a memory cell array 1506 and the like (see FIG. 20A). The memory cell array 1506 includes m word lines, n×j bit lines and m×j memory cells 1507 arranged in matrix.

The memory cells 1507 includes n memory elements 1508 (1) to 1508 (n) (see FIG. 20B). Each of the n memory elements 1508 (1) to 1508 (n) includes a floating gate, a controlling gate, a source region and a drain region. Each controlling gate is connected to a common word line (denoted as "word" in the drawing). One of the source region and the drain region is connected to different bit lines (referred to as bit(1) to bit(n)) while the other is connected to a common electrode (SC).

A state that the memory cell 1507 can taken is $2^n$ states of (L, L, ..., L) to (H, H, ..., H). Among these states, a pair of states that k memory elements are in the L state and the (n−k) memory elements are in the H state can be selected as a pair of the state that cannot be electrically transited in either way. In this embodiment mode, data is stored by using a pair of such states.

Note that a state that n memory elements can be in is referred to as internal data of n-bit. The number of pairs of such states is $_nC_k$, which represents the amount of data that can be stored per memory cell. k being an integer as close to n/2 as possible is preferable since the largest amount of data can be stored. For example, when n=8 and k=4 are satisfied, the number of the states that a memory cell having four memory elements in the L state and four memory elements in the H state is 70 (=$_8C_4$). As compared to eight (=$_8C_1$) when k=1, eight times as much data or more can be stored.

Next, writing and reading of the memory cells 1507 are described. Here, it is assumed that i-bit data is stored in each memory cell. For example, provided that n=8 and k=4 are satisfied, each memory cell can store 70 values, thus 6-bit data can be stored.

The write circuit requires a logic circuit that converts i-bit data from outside into internal data of n-bit. The read circuit requires a logic circuit that converts internal data of n-bit into external data of i-bit. Further, the read circuit requires a logic circuit that determines if the internal data of n-bit corresponds to the external data. These circuits can be realized by using a logic synthesis tool.

Writing to the memory cells 1507 is performed when the memory cells are in a state of (L, L, ..., L). When the memory 1507 receives a control signal (Control) representative of writing, a voltage required for the writing is selected, a write circuit 1501 converts a data signal (Data) into n-bit internal data and sends it to an internal data bus. At the same time, an address signal is inputted to the row decoder 1503 and the column decoder 1504 and a memory cell is selected. As a result, a high-potential is applied to a word line connected to the selected memory cell while a high potential for writing corresponding to the internal data is applied to the bit line, thus writing is performed.

Next, a nonvolatile memory of which write circuit is simplified is described with reference to FIG. 22. The write circuit shown in FIG. 22 is a circuit to write i-bit external data into either of the two memory cells.

A nonvolatile memory shown in FIG. 22 includes memory cells 1700, a selector 1702, and a write circuit 1705 (see FIG. 22). Each of the memory cells 1700 includes n memory elements 1701 (1) to 1701 (n), the selector 1702 includes switches 1703 (1) to 1703 (n) and 1704 (1) to 1704 (n), and the write circuit 1705 includes switches 1706 (1) to 1706 (n) and a converting circuit 1707.

An operation of this circuit is described. The i-bit input data is converted into n-bit internal data through the converting circuit 1707 of which output controls the n switches 1706 (1) to 1706 (n). Then, GND is applied to an internal data bus corresponding to the L state of the internal data while Vw is applied to the internal data bus corresponding to the H state thereof. When the selector 1702 selects the memory cell 1700, the selected memory cell 1700 is written so as to be in a state corresponding to the internal data.

As for reading, when a memory receives a control signal (Control) representative of reading, a voltage required for the reading is selected and an address signal is inputted to the row decoder 1503 and the column decoder 1504 at the same time, and a memory cell is selected. Then, a potential of a bit line connected to the selected memory cell is inputted to the read circuit 1502. The read circuit 1502 reads out and outputs data based on the potential of the bit line. At this time, it is also a feature of the invention to output a valid signal that determines if the read data is reliable or not.

An example of a simplified read circuit is described with reference to FIG. 21. FIG. 21 shows a circuit that reads i-bit data from one of two memory cells.

A nonvolatile memory shown in FIG. 21 includes memory cells 1600, a selector 1602, and a read circuit 1605. Each of the memory cells 1600 includes n memory elements 1601 (1) to 1601 (n), the selector 1602 includes switches 1603 (1) to 1603 (n) and 1604 (1) to 1604 (n), and the read circuit 1605 includes an internal data reading circuit 1608, a converting circuit 1606, and a determining circuit 1607.

This circuit operates as follows. The selector 1602 selects the memory cell 1600 and turns ON the corresponding switch. Then, bit lines connected to n memory elements 1601 (1) to 1601 (n) in the memory cell 1600 are connected to the read circuit 1605. When the bit lines are connected to the read circuit 1605, n-bit internal data is read out by the internal data reading circuit 1608. Then, the n-bit internal data that is read out is converted into i-bit data through the converting circuit 1606 and outputted.

The determining circuit 1607 outputs a valid signal of "1" when k-bit is in the L state and (n−k)-bit is in the H state among n-bit internal data that is read out, while it outputs a valid signal of "0" in other cases. When the valid signal is "1", it is recognized that valid data is written in the memory cell that is read out. On the other hand, when the valid signal is "0", it can be determined that data is not stored in the memory cell. The valid signal "0" is outputted when reading a memory cell to which data is not yet written, a memory cell that has a data writing error, a memory cell to which an invalid additional writing is done and the like.

In terms of security, it is preferable to write data fully when writing, that is, to transit all the memory cells to be representative of the data. In that case, a valid signal becomes "1" all the time. Provided that the valid signal of "0" is outputted, an invalid additional writing and the like can be doubted, thus the reliability of data can be determined according to the valid signal. Accordingly, such a measure can be taken as to invalid the data of the memory cell that outputted "0".

In this manner, a nonvolatile memory that is high in security and data therein cannot easily be tampered with by an additional writing can be realized. In general, the larger the number of memory elements that form a memory cell is, that is, the larger n is, the amount of data per memory element can be increased.

Such an OTP type nonvolatile memory according to this embodiment mode can be used as a memory of a computer or various electronic devices. Besides, it can be used for an application that requires high security, such as an IC card and an IC tag.

Note that the IC card refers to a card that is formed by implanting a semiconductor integrated circuit (an IC chip) in a lamination form into a plastic card so that data can be stored. The IC cards can be categorized into "a contact type" and "a non-contact type" according to a system of reading and writing data. The non-contact type card is incorporated with an antenna that can communicate with a terminal by utilizing weak radio waves. This non-contact type chip is also referred to as a wireless chip.

Embodiment 1

In this embodiment, an OTP type nonvolatile memory formed of three memory elements that has two states of L (a first state) and H (a second state) and can be transited only from L to H by applying at least a voltage or a current is described. In this memory, a memory cell formed of three memory elements is a unit for storing data. Hereinafter described is a mode that data is stored by using a pair of the states in which one memory element is in the L state while the other is in the H state with reference to FIGS. 2A, 2B, 4, and 18. Note that, the first state and the second state refer to a threshold voltage, an ON current value, a resistance value, a direction of magnetization, a direction of magnetic field of a transistor and the like.

Figure 2A:
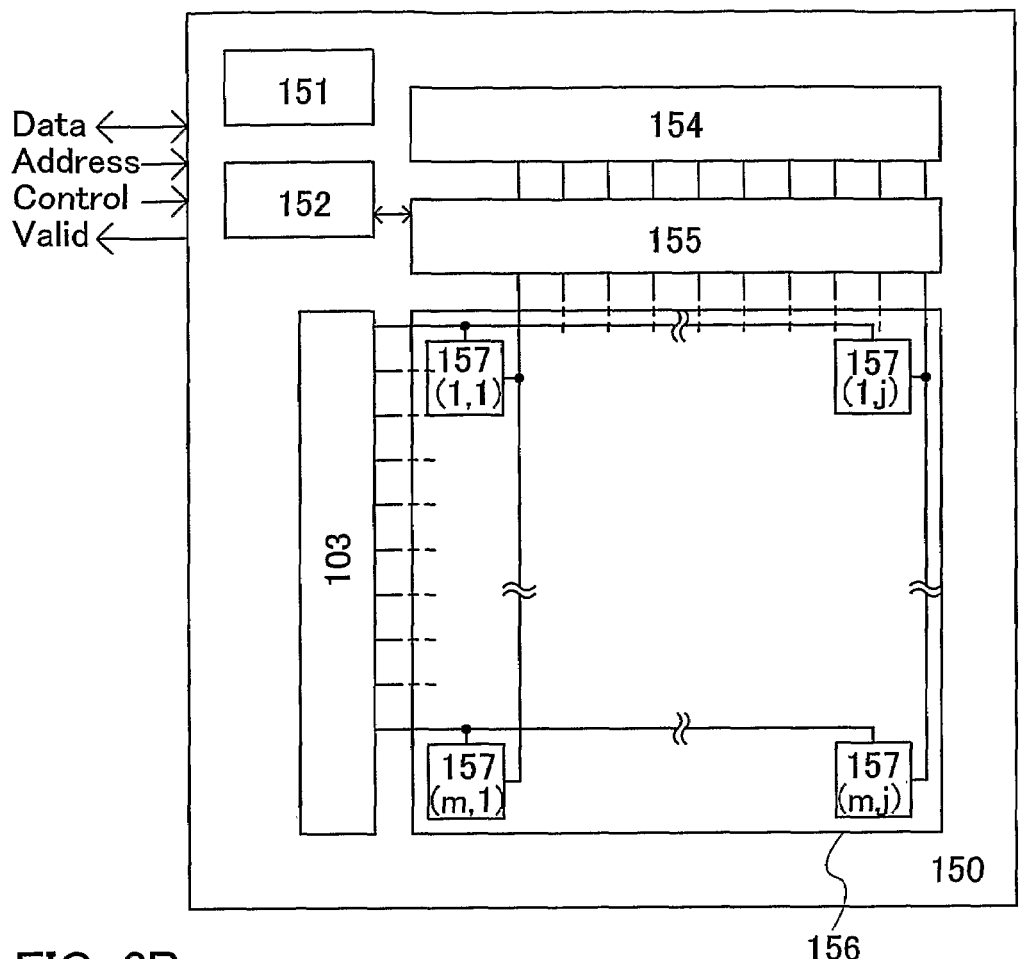
FIGS. 2A and 2B are block diagrams showing configurations of the nonvolatile memory of the invention.

The OTP type nonvolatile memory of the invention includes a write circuit 151, a read circuit 152, a row decoder 153, a column decoder 154, a selector 155, a memory cell array 156 and the like over a substrate 150 (see FIG. 2A). The memory cell array 156 includes m word lines, 3×j bit lines, and m×j memory cells 157 arranged in matrix.

Figure 2B:
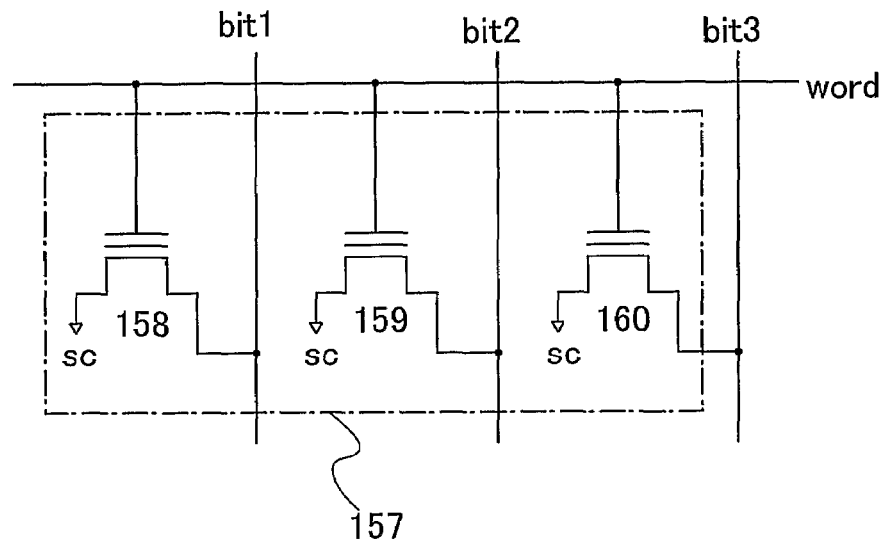

The memory cell 157 includes a first memory element 158, a second memory element 159, and a third memory element 160 (see FIG. 2B). Each of the first memory element 158, the second memory element 159, and the third memory element 160 includes a floating gate, a controlling gate, a source region and a drain region. The controlling gates of the first memory element 158, the second memory element 159, and the third memory element 160 are connected to a common word line (word). One of the source regions and the drain regions of the first memory element 158, the second memory element 159, and the third memory element 160 is connected to different bit lines (bit1, bit2, and bit3) respectively while the other is connected to a common electrode (SC).

Figure 19:
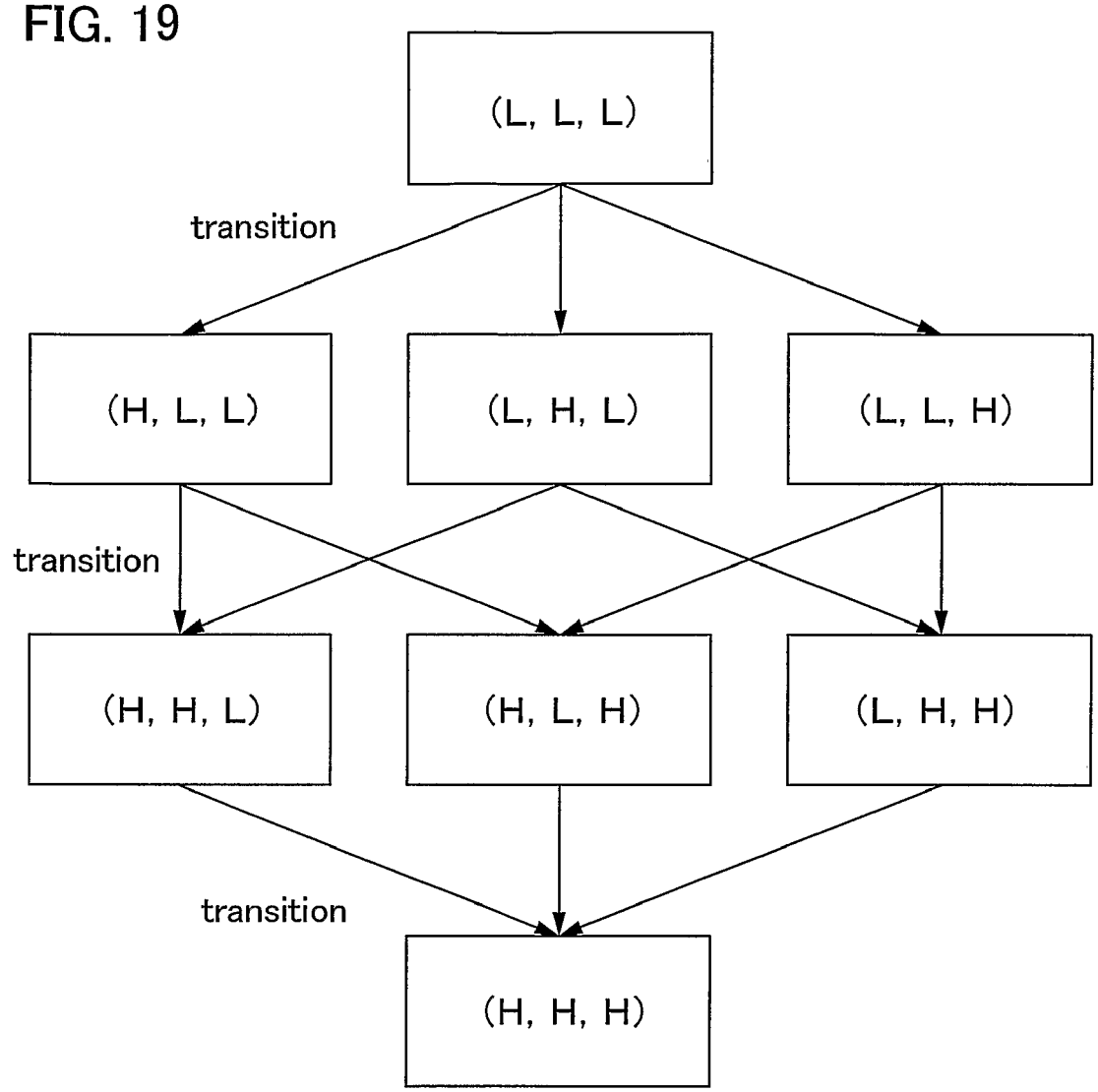
FIG. 19 is a diagram showing transitions of a state of a memory cell according to the invention.

A state that the memory cell 157 can be in and an acceptable transition are described with reference to FIG. 19. The memory cell 157 can take eight states among which "a pair of the states in which one memory element is in the L state and two memory elements are in H state (three states)" or "a pair of the states in which one memory element is in the H state and two memory elements are in the L state (three states)" can be selected as a pair of the states that cannot be transited in either direction.

Each of the three states cannot transit to other states. That is, a state (H, L, L), a state (L, H, L), and a state (L, L, H) cannot transit to each other. Similarly, a state (H, H, L), a state (H, L, H), and a state (L, H, H) cannot transit to each other as well.

By employing any one of the three states that cannot transit to each other, 3-digit data of high security can be stored in three memory elements.

Now a comparison is made between the case of forming a memory cell of two memory elements and the amount of data per memory element. When two memory elements are used, 2-digit data of (H, L) and (L, H) can be stored as a pair that cannot transit to each other. When six memory elements are used, in the case of using two memory elements for a memory cell, 2×2×2=8 values, and in the case of using three memory elements for a memory cell, 3×3=9 values can be stored respectively. That is, by using three memory elements, the amount of data stored per memory element is larger as compared to a memory cell using two memory elements.

Here, states of the memory cell 157 used as data are a state (H, L, L), a state (L, H, L), and a state (L, L, H), to which data "00", "01", and "10" are applied respectively.

Writing to the memory cell 157 is performed when the memory cell 157 is in a state of (L, L, L). When the memory 157 receives a control signal (Control) representative of writing, a voltage required for the writing is selected, a write circuit 151 converts a data signal (Data) into (H, L, L), (L, H, L), or (L, L, H) in an internal data form and sends it to an internal data bus. At the same time, an address signal is inputted to the row decoder 153 and the column decoder 154 and a memory cell is selected. As a result, a high potential is applied to a word line connected to the selected memory cell while a high potential for writing corresponding to the internal data is applied to the bit line.

In the case of applying a high potential to a bit line connected to the first memory element 158, a state of (H, L, L) is obtained, thus data stored in the memory cell 157 becomes "00". Similarly, in the case of applying a high potential to a bit line connected to the second memory element 159, a state of (L, H, L) is obtained, thus data stored in the memory cell 157 becomes "01". In the case of applying a high potential to a bit line connected to the third memory element 160, a state of (L, L, H) is obtained, thus data stored in the memory cell 157 becomes "10".

Figure 18:
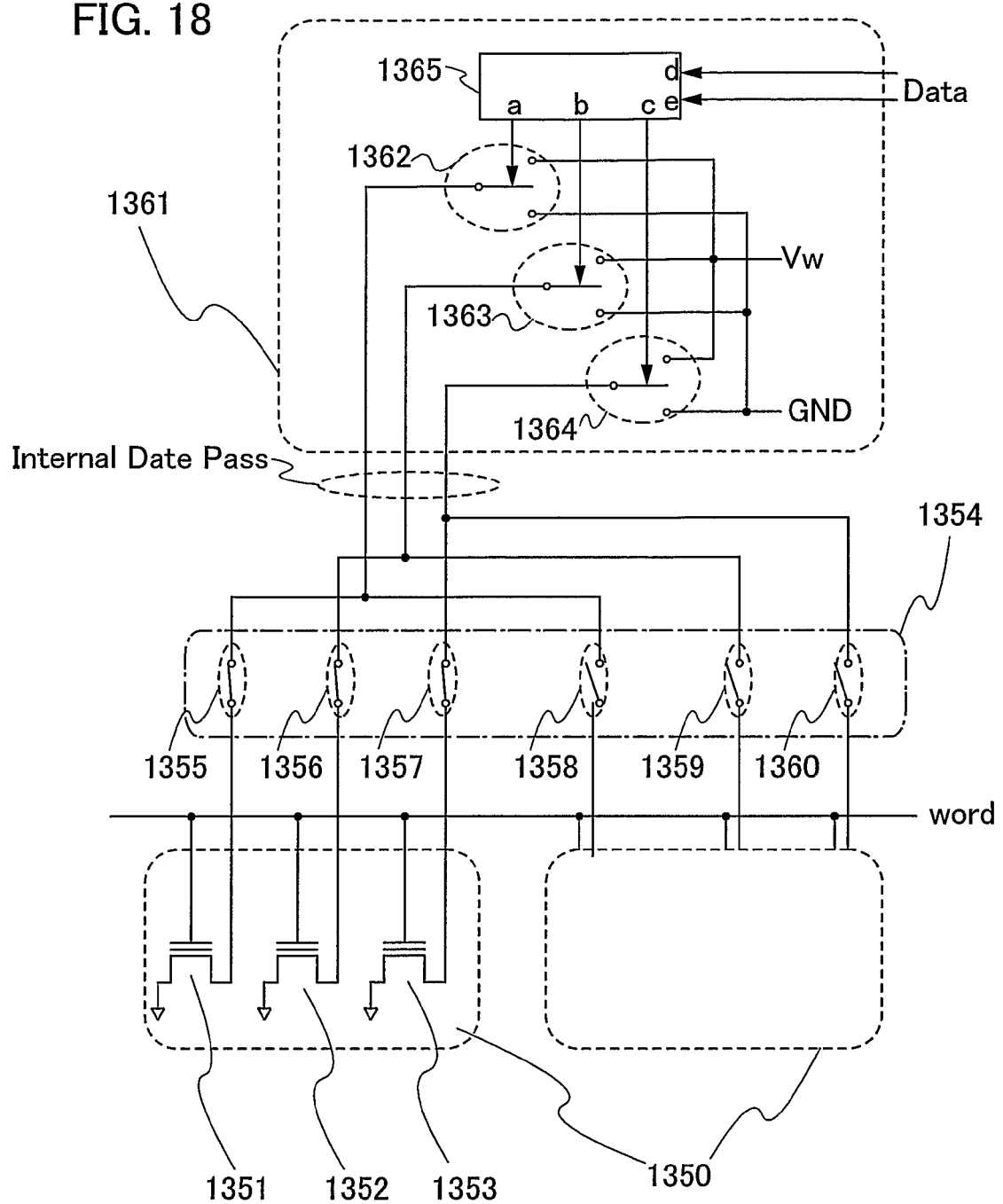
FIG. 18 is a diagram showing a write circuit of the nonvolatile memory of the invention.

An example of a simplified write circuit is described with reference to FIG. 18. FIG. 18 shows a circuit that writes external data of "00", "01", or "10" to one of two memory cells.

A nonvolatile memory shown in FIG. 18 includes memory cells 1350, a selector 1354, and a write circuit 1361. Each of the memory cells 1350 includes a first memory element 1351, a second memory element 1352, and a third memory element 1353, the selector 1354 includes switches 1355 to 1365, and the write circuit 1361 includes switches 1362 to 1364, and a converting circuit 1365.

Figure 6:
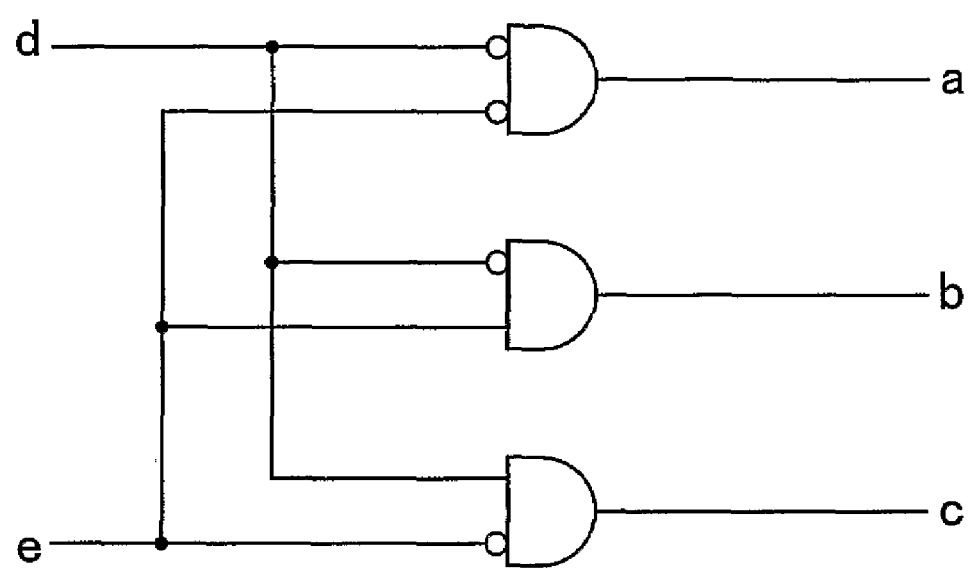
FIG. 6 is a diagram showing a portion of a write circuit of the nonvolatile memory of the invention.

This circuit operates so that inputted data controls the switches 1362, 1363, and 1364 according to an output of the converting circuit 1365, GND is applied to an internal data bus corresponding to the L state of the internal data, and Vw is applied to the internal data bus corresponding to the H state thereof. Note that the converting circuit 1365 can be configured easily by using a combination circuit as shown in FIG. 6.

In specific, when the inputted data is "00", the circuit drives so that three internal data buses have (Vw, GND, GND). When the selector 1354 selects the memory cell 1350, the selected memory cell 1350 is written so as to be in a state of (H, L, L). Similarly, when the inputted data is "01", the circuit drives so that the three internal data buses have (GND, Vw, GND) and the selected memory cell 1350 is written so as to be in a state of (L, H, L). When the inputted data is "10", the circuit drives so that the three internal data buses have (GND, GND, Vw) and the selected memory cell 1350 is written so as to be in a state of (L, L, H).

A transition of states of the memory element is one direction from L to H, as described above. That is, a possible transition of the states is from (L, L, L) to (H, L, L), (L, H, L), or (L, L, H). (H, L, L) and (L, H, L) cannot be transited to each other. As a result, data that once becomes "00" cannot be converted into "01" or "10".

For example, when the memory cell 157 having data of "00" is written and the second memory element 159 is charged, a state of (H, H, L) is obtained, which is processed as invalid data. The same applies to the case of writing to a memory cell having data of "01" and inputting to a controlling gate of the first memory element 158. In this manner, a nonvolatile memory that is high in security and data therein cannot easily be tampered with by an additional writing can be realized.

As for reading, when a memory receives a control signal (Control) representative of reading, a voltage required for the reading is selected and an address signal is inputted to the row decoder 153 and the column decoder 154 at the same time, and a memory cell to be read is selected. Then, a potential of a bit line connected to the selected memory cell is inputted to the read circuit 152. The read circuit 152 reads out data based on the potential of the bit line and outputs it after converting into external data. At this time, it is also a feature of the invention to output not only data but also a valid signal that determines if the read data is reliable or not.

Figure 4:
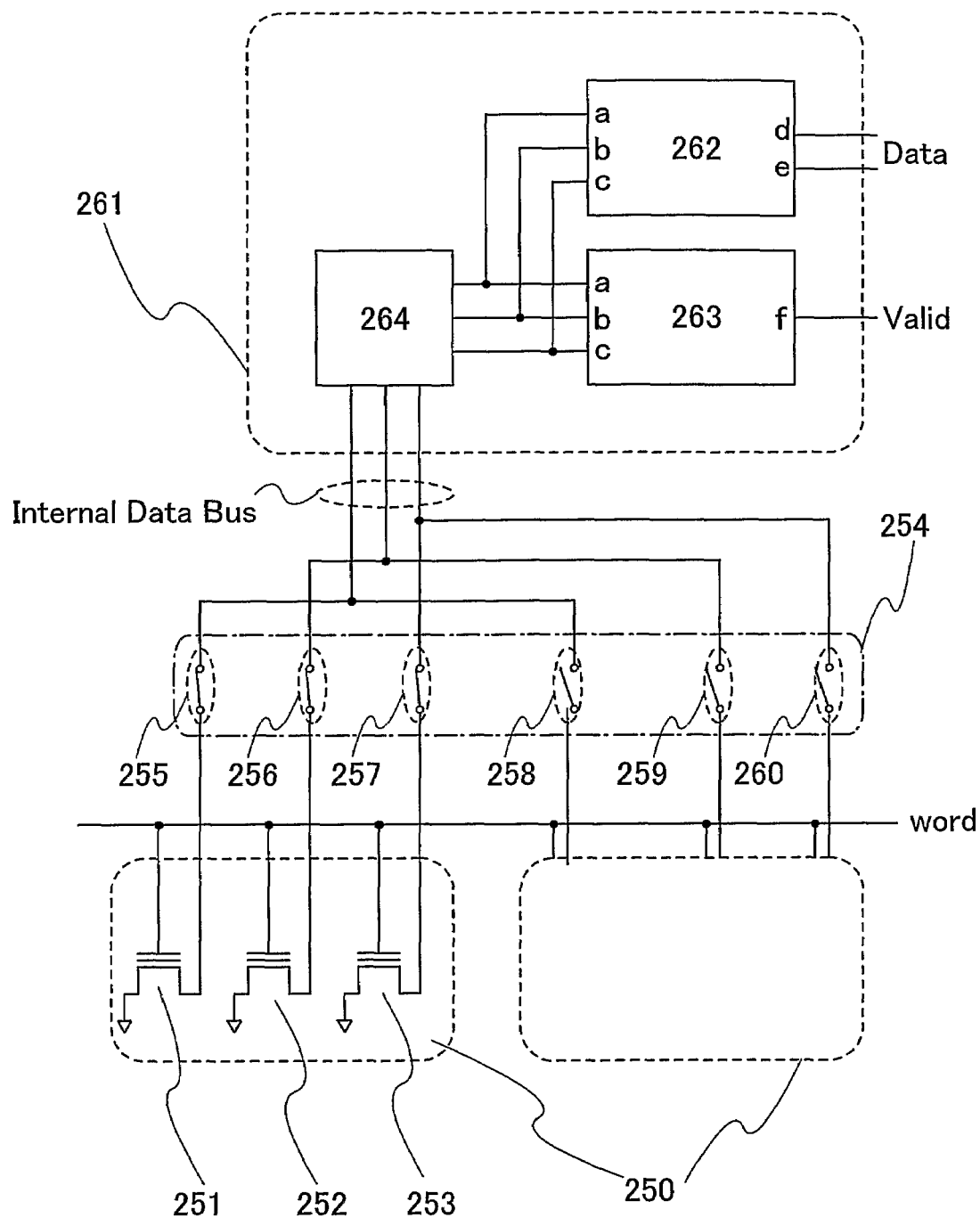
FIG. 4 is a diagram showing a read circuit of the nonvolatile memory of the invention.

A configuration example of a read circuit is described with reference to FIG. 4. FIG. 4 shows a circuit that reads data of "00", "01", and "10" from one of two memory cells.

A nonvolatile memory shown in FIG. 4 includes memory cells 250, a selector 254, and a read circuit 261. Each of the memory cells 250 includes a first memory element 251, a second memory element 252, and a third memory element 253, the selector 254 includes switches 255 to 260, and the read circuit 261 includes an internal data reading circuit 264, a converting circuit 262, and a determining circuit 263.

In this circuit, the selector 254 selects a memory cell and turns ON the corresponding switch. Then, the circuit operates so that bit lines connected to the first memory element 251, the second memory element 252, and the third memory element 253 in the memory cell 250 are connected to the read circuit 261.

Figure 7:
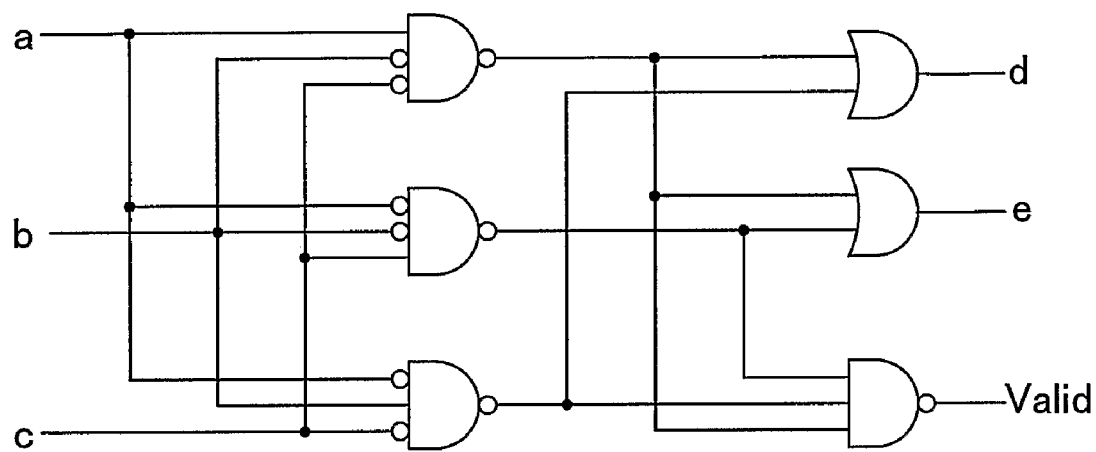
FIG. 7 is diagram showing a portion of a read circuit of the nonvolatile memory of the invention.

When the bit lines are connected to the read circuit 261, 3-bit internal data is read out by the internal data reading circuit 264. The read 3-bit internal data is outputted after being converted into data of "00", "01", and "10" by the converting circuit 262. The determining circuit 263 generates and outputs a valid signal. The converting circuit 262 and the determining circuit 263 can be configured easily by a combination circuit as shown in FIG. 7.

The determining circuit 263 determines reliability of data by using three read signals and asserts a valid signal when there is one element in the H state among the three memory elements. That is, a valid signal is "1" when the states of the first memory element 251, the second memory element 252, and the third memory element 253 are (H, L, L), (L, H, L), or (L, L, H), and "0" in other cases.

When the valid signal is "1", it is recognized that invalid data is written in the memory cell that has been read. On the other hand, when the valid signal is "0", it can be recognized that data is not stored in the memory cell. The valid signal "0" is outputted when reading a memory cell to which data is not yet written, a memory cell that has a data writing error, a memory cell to which an invalid additional writing is done and the like. In terms of security, such a measure as to invalidate the data of such a memory can be taken.

Embodiment 2

The nonvolatile memory of the invention that exhibits high security is suitable for applications such as an IC card, an ID card, an ID tag, an RFID card or various tags that require emphasis on the prevention of forgery and abuse.

An ID card refers to what is specialized in certification function particularly for ID purposes with similar functions and structures to an IC card.

An ID tag stores data such as an identification code of itself in a micro IC chip used for identifying an object (an IC chip for this application is also referred to as an ID chip in particular), and has a function to transmit/receive data with a management system through radio waves. An IC chip having a size of several tens millimeters can communicate with a reader through radio waves and electromagnetic waves. An ID tag can be used semi-permanently without a battery by virtue of a non-contact power transmitting technique from an antenna.

An RFID refers to radio frequency identification, which is an identification technique that works by a reader/writer device and an ID tag that can communicate data wireless. There are various modes for an ID tag used for the RFID, such as a card type, a label type, and a certificate type, which are referred to as semiconductor devices.

Meanwhile, the nonvolatile memory of the invention is rather larger than a conventional OTP type nonvolatile memory in the memory cell area. Provided that eight memory elements are included per memory cell, for example, 6-bit data can be stored; however, the memory cell area is increased by about 25% as compared to the conventional case of storing 8-bit data. By forming integrated circuits in an IC card and an RFID over a large glass substrate instead of a conventional silicon substrate as a measure for the aforementioned problem, a number of integrated circuits can be manufactured and manufacturing cost can be reduced. Alternatively, although a chip area has a great influence on the shock resistance much, it is quite efficient in improving the shock resistance to stick the integrated circuit to a flexible substrate and a target after peeling a device layer off a glass substrate on which the integrated circuits are formed.

Note that a flexible substrate is a substrate having flexibility, including a plastic substrate and paper representatively. For the plastic, for example, polynorbornene, polyethylene terephthalate (PET), polyether sulfone (PES), polyethylene naphthalate (PEN), polycarbonate (PC), nylon, polyether etherketone (PEEK), polysulfone (PSF), polyether imide (PEI), poly arylate (PAR), polybutylene terephthalate (PBT), polyimide and the like can be used.

Figure 9:
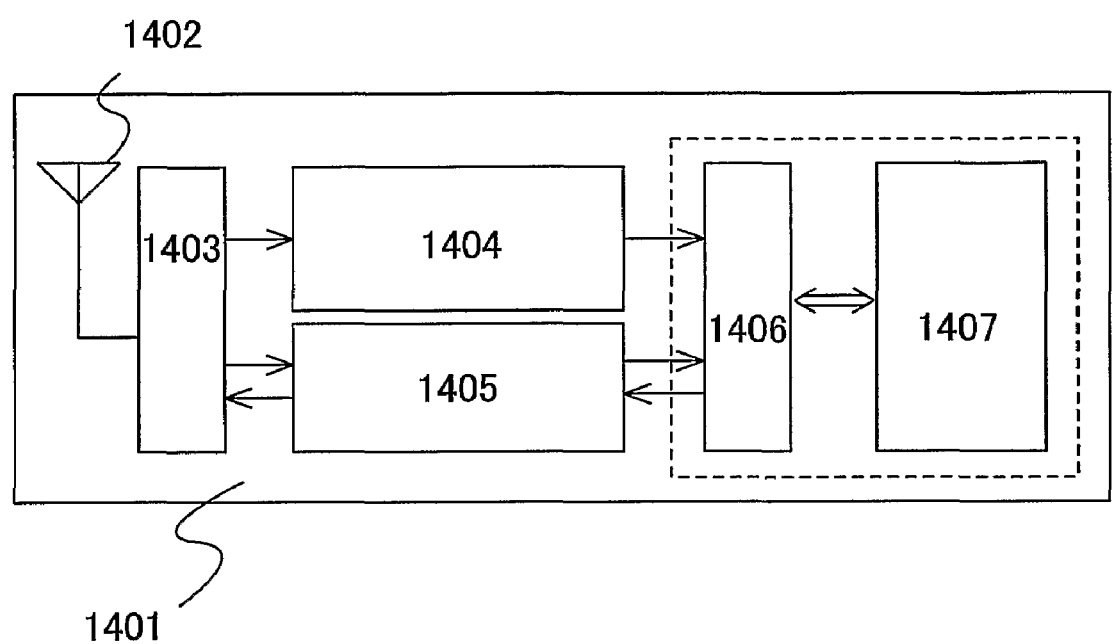
FIG. 9 is a diagram showing an application of the nonvolatile memory of the invention.

FIG. 9 is a block diagram as a simple configuration example of an ID chip using the nonvolatile memory of this embodiment. A non-contact type ID chip incorporating an antenna is shown.

In FIG. 9, an ID chip 1401 includes an antenna 1402, an RF circuit 1403, a power source/clock signal/reset signal generating circuit 1404, a data demodulating/modulating circuit 1405, a controlling circuit 1406, a memory 1407, a CPU (Central Processing Unit) (not shown), and an SRAM (not shown).

The integrated circuits shown in FIG. 9 are all formed over a glass substrate or a flexible substrate. The antenna 1402 may be formed over a substrate on which the integrated circuits are formed or may be provided outside the substrate on which the integrated circuits are formed and be connected to the integrated circuits through an input/output terminal.

The RF circuit 1403 receives an analog signal from the antenna 1402 as well as outputs the analog signal from the antenna 1402, which is received from a data modulating circuit. The power source/clock signal/reset signal generating circuit 1404 generates a constant power source, a reset signal and a clock signal based on the received signal. The data demodulating/modulating circuit 1405 extracts data from the received signal as well as converts a digital signal received from the controlling circuit 1406 into an analog signal to be outputted to the antenna 1402.

On the other hand, the controlling circuit 1406 controls the CPU and reads out or writes data stored in the memory 1407 and the SRAM in accordance with the demodulated received signals.

The nonvolatile memory of this embodiment is applied to the memory 1407. Note that the CPU and the SRAM are not necessarily provided in the configuration of the circuit depending on the application and may be omitted for reduction in area. Even if a function of an ID chip is limited, for example, to read fixed data such as an identification number, a network technique such as Internet can complement a lacking function. Thus, an ID chip can be used for various applications.

An ID chip formed in this manner can be downsized and can be stuck to or incorporated in various objects. Thus, identification of products and manufacturers, management of stock and circulation and the like can be easily performed. An ID chip can be formed in a size of 5 mm square or preferably 0.3 to 4 mm square.

FIGS. 16A to 16H show examples to which an ID chip formed by using the nonvolatile memory of the invention is applied.

Figure 16A:
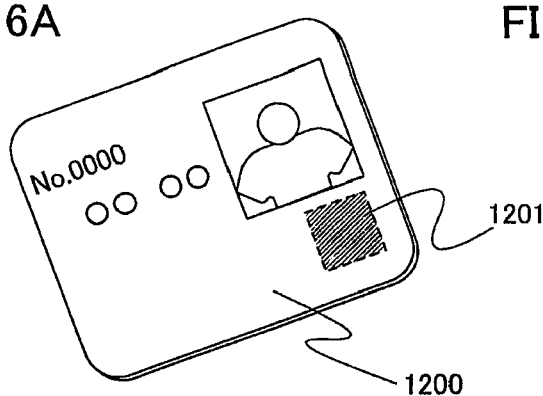
FIGS. 16A to 16H are views showing applications of the nonvolatile memory of the invention.

FIG. 16A illustrates an IC card that can be used for identifying an individual, which requires high security by utilizing advantages of the nonvolatile memory of the invention that cannot easily be reprogrammed. The nonvolatile memory of the invention is used for an incorporated memory 1201 in an IC card 1200.

Figure 16B:
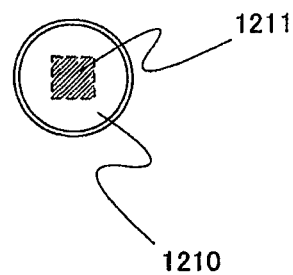

FIG. 16B illustrates an ID tag that can be used for identifying an individual, entrance management in a specific place and the like since it can be downsized. The nonvolatile memory of the invention is used for an incorporated memory 1211 in an ID tag 1210.

Figure 16C:
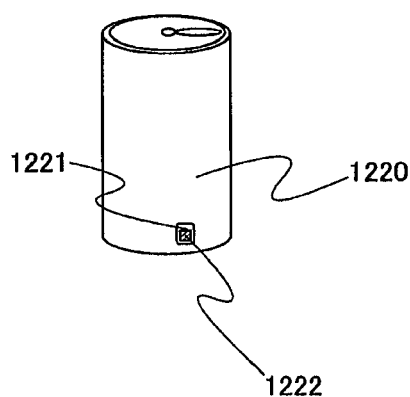

FIG. 16C illustrates an example of sticking an ID chip 1222 to a product for product management at a retail store such as a supermarket. The invention is applied to a nonvolatile memory incorporated in a circuit in the ID chip 1222. In this manner, by using an ID chip, stock management can be facilitated as well as shoplifting and the like can be prevented. In FIG. 16C, a protective film 1221 that also has adhesion for preventing the ID chip 1222 from falling off is used, however, the ID chip 1222 may directly be stuck by using an adhesive as well. It is preferable to manufacture a substrate by using a flexible substrate considering that the ID chip 1222 is stuck to a product 1220.

Figure 16D:
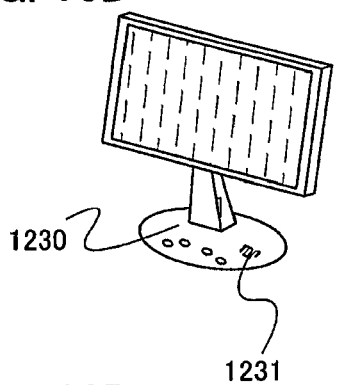

FIG. 16D illustrates an example of incorporating an ID chip for identification when manufacturing a product. In FIG. 16D, an ID chip 1231 is incorporated inside a housing 1230 of a display as an example. The invention is applied to a nonvolatile memory incorporated in a circuit in the ID chip 1231. With this structure, identification of a manufacturer, circulation management of products and the like can be facilitated. Note that a housing of a display is taken as an example here, however, the invention is not limited to this and can be applied to various objects.

Figure 16E:
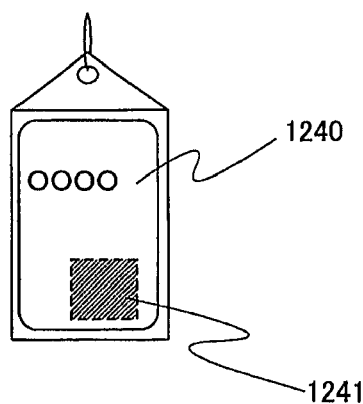

FIG. 16E illustrates a shipping tag for transferring objects. In FIG. 16E, an ID chip 1241 is incorporated in a tag 1240. The invention is applied to a nonvolatile memory incorporated in a circuit in the ID chip 1241. With this structure, identification of a manufacturer, circulation management of products and the like can be facilitated. Note that the tag 1240 is tied to a string or the like for tying an object; however, the invention is not limited to this and can be directly stuck to an object by using a sealant or the like.

Figure 16F:
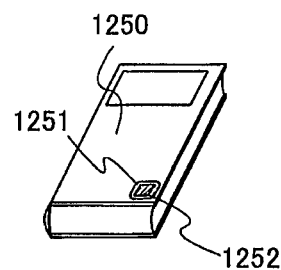

FIG. 16F illustrates an ID chip 1252 incorporated in a book 1250. The invention is applied to a nonvolatile memory incorporated in the ID chip 1252. With this structure, circulation management at a bookstore, a library and the like can be facilitated. In FIG. 16F, a protective film 1251 that also has adhesion for preventing the ID chip 1252 from falling off is used, however, the ID chip 1252 may directly be stuck by using an adhesive or incorporated in a cover of the book 1250.

Figure 16G:
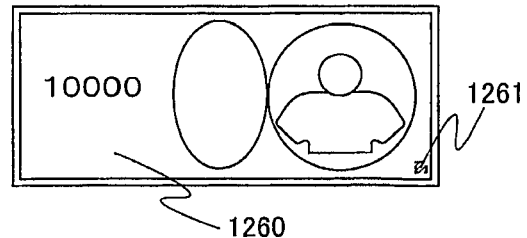

FIG. 16G illustrates an RFID chip 1261 incorporated in paper money 1260. The invention is applied to a nonvolatile memory incorporated in the ID chip 1261. With this structure, circulation of counterfeits can be easily prevented. The RFID chip 1261 can be applied not only to paper money but also to securities such as a certificate of stock, a gift certificate, and a check. In view of property of paper money, it is more preferable that the ID chip 1261 be embedded in the paper money 1260 so as not to fall off.

Figure 16H:
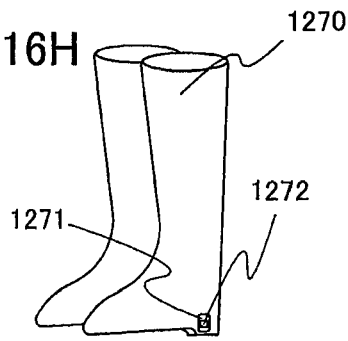

FIG. 16H illustrates an ID chip 1272 incorporated in a shoe 1270. The invention is applied to a nonvolatile memory incorporated in a circuit in the ID chip 1272. With this structure, identification of a manufacturer, circulation management of products and the like can be facilitated. In FIG. 16H, a protective film 1271 that also has adhesion for preventing the ID chip 1272 from falling off is used, however, the ID chip 1272 may directly be stuck by using an adhesive or incorporated in the shoe 1270.

In any cases, by incorporating the nonvolatile memory of the invention, high security that can prevent data from being reprogrammed carelessly can be realized.

Note that the examples shown in this embodiment are only examples and the invention is not limited to these applications. This embodiment can be freely implemented in combination with other embodiments.

Embodiment 3

Here, description is made with reference to FIGS. 5 and 23 on a method for manufacturing the memory element described in the embodiment mode and thin film transistors (hereinafter also referred to as TFTs) that are used for the memory element and a logic circuit portion such as the decoder, the selector, the write circuit, and the read circuit described in the embodiment mode, over an insulating substrate at the same time. Note that in this embodiment, an n-channel memory element having a floating gate, an n-channel TFT, and a p-channel TFT are taken as examples of semiconductor elements, however, the semiconductor element included in the memory portion and the logic circuit portion is not limited to these. Further, this manufacturing method is only an example and does not limit the manufacturing method over the insulating substrate.

For the insulating substrate, a glass substrate (for example, Corning 1737 substrate) is used. Besides, a quartz substrate, a substrate formed of an insulating substance such as alumina, a silicon wafer substrate, a plastic substrate having heat resistance that can resist the processing temperature of a subsequent step, and the like can be used as well.

Base films 3001 and 3002 are formed over an insulating substrate 3000 by using an insulating film such as a silicon oxide film, a silicon nitride film, or a silicon oxynitride film. The base films can be formed by stacking a plurality of films as well. In that case, siloxane (a material having Si—O bond as a backbone structure and at least hydrogen as a substituent) is used. Moreover, heat resistant resin having at least one of fluoride, alkyl group, or aromatic carbon hydride as a substituent may be formed by a spin coating method, a slit coating method, a liquid droplet discharging method, and the like. It is more preferable that a silicon nitride film formed in thickness of 50 to 200 mm as the base film 3001 and a silicon oxide film formed in thickness of 50 to 200 nm as the base film 3002 be stacked in this order.

Here, the silicon oxide film can be formed by thermal CVD, plasma CVD and the like by using a mixture gas of $SiH_4/O_2$, TEOS (tetra ethoxy silane)/$O_2$ and the like. The silicon nitride film can be formed by plasma CVD using a mixture gas of $SiH_4/NH_3$ representatively. The silicon oxynitride film can be formed by plasma CVD using a mixture gas of $SiH_4/N_2O$.

Semiconductor layers 3003 to 3005 are formed over the base film 3002. The semiconductor layers 3003 to 3005 are formed of a polycrystalline semiconductor or a semi-amorphous semiconductor. A semiconductor having silicon, silicon germanium (SiGe) and the like as a main component can be used for the both.

Here, polycrystalline silicon obtained by forming amorphous silicon in thickness of 70 nm and crystallizing by laser annealing is used. The laser annealing is performed for crystallization using pulsed laser light using an excimer laser or continuous wave laser light using a solid laser as a light source. In particular, for obtaining crystal grains of large diameter in crystallization, it is preferable to apply second to fourth high harmonic waves of a fundamental wave by using a solid laser capable of continuous oscillation (the crystallization in this case is referred to as CWLC). Typically, a second high harmonic wave (532 nm) or a third high harmonic wave (355 nm) of $Nd:YVO_4$ laser (fundamental wave of 1064 nm) are applied. In the case of using the continuous oscillation laser, a laser light irradiated from the continuous oscillation $YVO_4$ laser with an output of 10 W is transformed into high harmonic wave by using a non-linear optical element. Also, a high harmonic wave can be irradiated by using a $YVO_4$ crystal or a $GdVO_4$ crystal and a non-linear optical element in a resonator. Preferably, the high harmonic wave is shaped into a laser light of a rectangular form or an elliptical form on the irradiated surface by an optical system, and then irradiated to an object to be processed. The energy density at this time is required to be about 0.01 to 100 $MJ/cm^2$ (preferably 0.1 to 10 $MJ/cm^2$). A semiconductor film is to be moved relatively to the laser light at a rate of about 10 to 2000 cm/sec.

In the case of using a pulsed oscillation laser, a frequency band of several tens to several hundreds Hz is used, however, a pulsed oscillation laser having an oscillation frequency of 10 MHz or more may be used as well (the crystallization at this time is referred to as MHzLC). It is said that it takes several tens to several hundreds nsec until a semiconductor film is completely solidified after being irradiated with a pulsed oscillation laser light. Therefore, by using the aforementioned high frequency band, next pulsed laser light can be irradiated before the semiconductor film is solidified after fusing by a laser light. Accordingly, the solid-fluid interface in the semiconductor film can be moved continuously, differently from the case of using a conventional pulsed wave laser. Thus, a semiconductor film having crystal grains that are aligned along the scan direction can be formed. Specifically, an aggregation of crystal grains can be obtained where the crystal grains in the scan direction are 10 to 30 µm wide while the crystal grains in the perpendicular direction to the scan direction are 1 to 5 µm wide. By forming crystal grains of single crystals to be aligned along the scan direction, a semiconductor film having few crystal grains at least in the channel direction of a TFT can be obtained.

A semi-amorphous semiconductor has an intermediate structure between the amorphous structure and the crystalline structure (including single crystalline and polycrystalline structures), which is a semiconductor having a third state that is stable in free energy. Also, semi-amorphous semiconductor includes a crystalline region having a short-range order and lattice distortion. Raman spectrum of the semi-amorphous semiconductor is shifted to a low frequency side from 520 $cm^{-1}$, and at least 1 atomic % of hydrogen or halogen is contained for terminating dangling bonds. A semi-amorphous semiconductor is also referred to as a microcrystalline semiconductor. $SiH_4$ and $F_2$, or $SiH_4$ and $H_2$ are used as a source material gas for glow discharge decomposition to form a semi-amorphous semiconductor. Besides, $SiH_4$, $Si_2H_6$, $SiH_2Cl_2$, $SiHCl_3$, $SiCl_4$, $SiF_4$ and the like can be used. $GeF_4$ may be mixed as well.

A known crystallizing method may be used using a catalytic activity of a metal element such as Ni, Fe, Ru, Rh, Pd, Os, Ir, and Pt.

In the case of using siloxane as heat resistant organic resin for a portion of the base film 3002, it can be prevented that heat leaks from the semiconductor film during the crystallization, thus the crystallization can be efficiently performed.

By the aforementioned method, a crystalline silicon semiconductor film is obtained. The crystalline layer is preferably formed in thickness of 20 to 200 nm (representatively 40 to 170 nm, and more preferably 50 to 150 nm).

In a channel region of a TFT, in particular, hydrogen or halogen of $1\times10^{19}$ to $1\times10^{22}$ $cm^{-3}$, or preferably $1\times10^{19}$ to $5\times10^{20}$ $cm^{-3}$ is desirably doped. The semi-amorphous semiconductor is preferably doped with hydrogen or halogen of $1\times10^{19}$ to $2\times10^{21}$ $cm^{-3}$. In any cases, it is preferable that more hydrogen or halogen be contained than that contained in a single crystal used for an IC chip. Accordingly, a local crack in a TFT portion can be terminated by hydrogen or halogen.

Here, a process for providing an overlapped region for extracting charges to one side of a source region or a drain region of a semiconductor layer 3003 of a TFT used for the memory element may be performed.

Next, a gate insulating film 3006 is formed over the semiconductor layers 3003 to 3005. The gate insulating film is formed from a single layer or stacked-layer of a film containing silicon nitride, silicon oxide, silicon oxynitride or silicon nitride oxide by a thin film forming method such as plasma CVD and sputtering. In particular, writing and charge retention by injecting hot electron are essential in an OTP type nonvolatile memory, therefore, it is preferable to form a gate insulating film in 40 to 80 nm that does not pass a tunnel current easily.

First conductive layers 3007 to 3009 are formed over the gate insulating film 3006 and removed by etching except for a region including a region to be a floating gate electrode and a region to be a gate electrode of a TFT later.

Next, a second insulating film 3010 is formed. The second gate insulating film 3010 is formed of an insulating film containing silicon in thickness of 10 to 80 nm by plasma CVD or sputtering. The gate insulating film 3006 is removed by etching except for a region where a memory element is formed.

Next, second conductive layers 3011 to 3013 are formed. Stacked layers of the first conductive layer 3007, the second gate insulating film 3010, and the second conductive layer 3011 (memory element) in this order from the bottom, or stacked layers of the first conductive layer 3007 and the second conductive layer 3011 (a normal TFT) from the bottom are etched altogether, and a floating gate electrode, a controlling gate electrode of the memory element and a gate electrode of a normal TFT are formed.

In this embodiment, the first conductive layers 3007 to 3009 are formed from tantalum nitride (TaN) in thickness of 50 to 100 nm while the second conductive layers 3011 to 3013 are formed from molybdenum (Mo) in thickness of 100 to 300 nm. A material of the conductive layer is not particularly limited, and may be formed from an element selected from Ta, W, Ti, Mo, Al, Cu, and the like or an alloy material or a compound material containing the aforementioned element as a main component.

Next, a portion to be a p-channel TFT is covered with a resist, and impurity elements imparting n-type conductivity (typically P (phosphorus) or As (arsenic)) are doped to the semiconductor layers 3003 and 3004 that form the memory element and the n-channel TFT at a low concentration (first doping step). The first doping step is performed with a dosage of $1 \times 10^{13}$ to $6 \times 10^{13}/cm^2$ and an acceleration voltage of 50 to 70 keV, however, the invention is not limited to these. By the first doping step, through doping is performed through the gate insulating film 3006, thereby a pair of low concentration impurity regions are formed. Note that the first doping step may be performed on the whole surface without covering the p-channel TFT region with a resist.

Next, the resist is removed by ashing or the like and another resist that covers the memory element and the n-channel TFT region is formed. Then, impurity elements imparting p-type conductivity (typically B (boron)) are doped to the semiconductor layer 3005 that forms the p-channel TFT at a high concentration with the gate electrode as a mask (a second doping step). The second doping step is performed with a dosage of $1 \times 10^{16}$ to $3 \times 10^{16}/cm^2$ and an acceleration voltage of 20 to 40 keV. By the second doping step, through doping is performed through the gate insulating film 3006, thereby a pair of p-type high concentration impurity regions are formed.

Next, the resist is removed by ashing and the like and an insulating film is formed over the surface of the substrate. Here, a $SiO_2$ film is formed in thickness of 100 nm by plasma CVD. After that, the whole surface of the substrate is covered with resist and side walls 3020 and 3021 are formed in a self-aligned manner by an etch back method. For an etching gas, a mixture gas of $CHF_3$ and He is used.

The sidewalls 3020 and 3021 are provided as masks used when forming a low concentration impurity region or a non-doped offset region under the sidewalls 3020 and 3021.

Figure 23A:
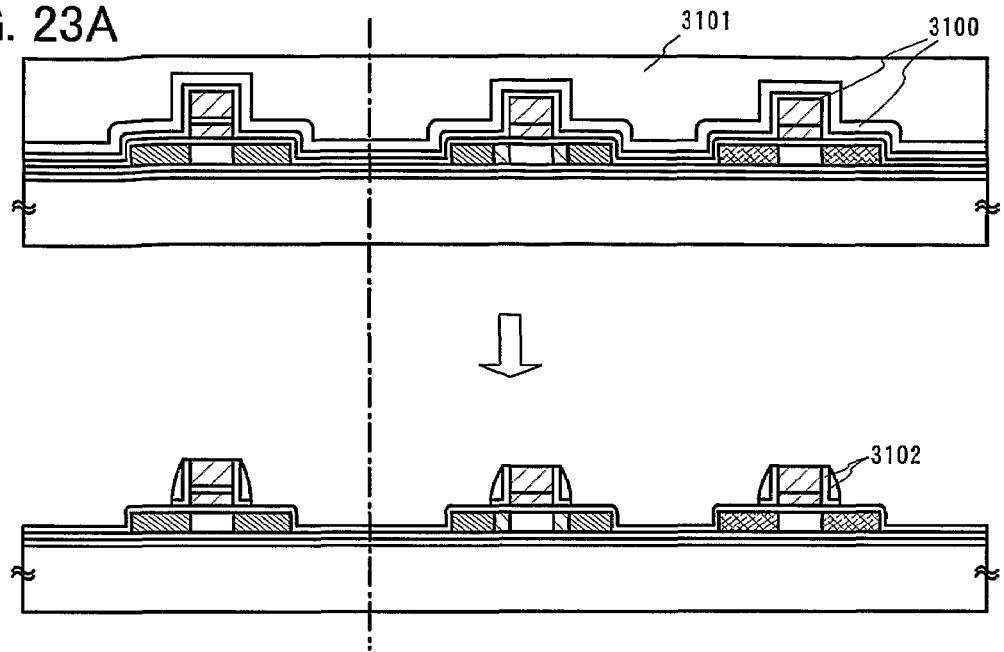
FIGS. 23A and 23B are diagrams showing a manufacturing process of a TFT on an insulating substrate of the invention.

A step of forming the sidewalls 3020 and 3021 is not limited to these. For example, a method shown in FIGS. 23A and 23B can be used. FIG. 23A shows an example of an insulating film 3100 having a stacked-layer structure of two or more layers. The insulating film 3100 has a two-layer structure of a silicon oxynitride film in thickness of 100 nm and an LTO film (Low Temperature Oxide film) in thickness of 200 nm, for example. Here, a SiON film is formed by plasma CVD and the LTO film is formed of a silicon oxide film by low pressure CVD. After that, by performing an etch back with the resist 3101 as a mask, a sidewall 3102 having an L-shape and a circular arc shape is formed.

Figure 23B:
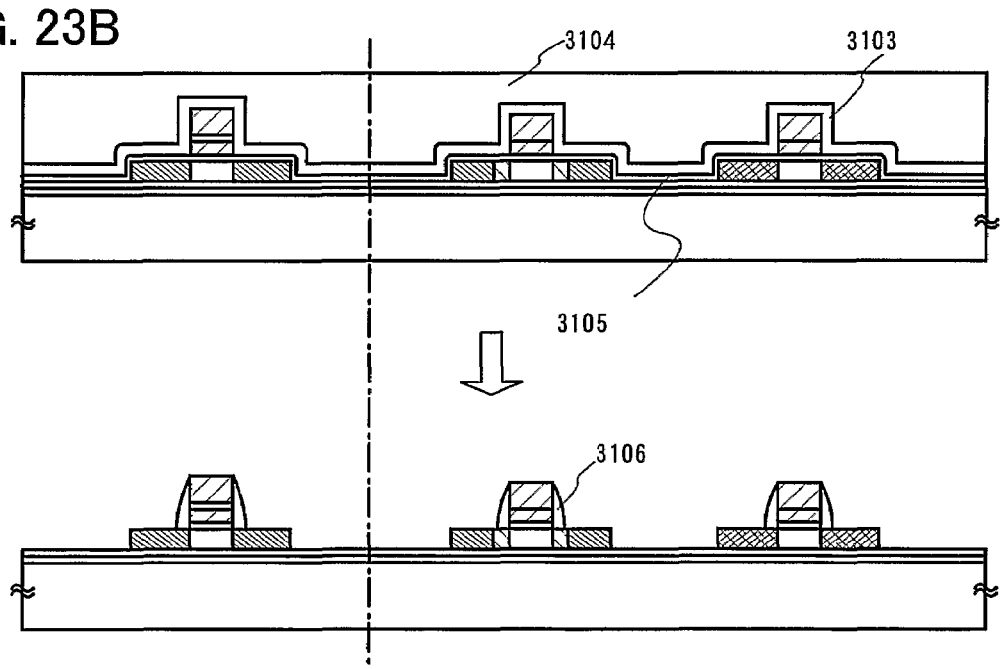

FIG. 23B shows an example of etching for removing the gate insulating film 3105 when performing the etch back. For the insulating film 3103, a silicon oxide film is formed by plasma CVD in thickness of 100 nm, the whole surface of the substrate is covered with a resist 3104, and then the resist 3104, the insulating film 3103, and the gate insulating film 3105 are removed by etching, thereby a sidewall 3106 is formed in a self-aligned manner. The insulating film 3103 at this time may have a single-layer structure or a stacked-layer structure.

In any of the forming methods of a sidewall described above, a condition of etch back is to be appropriately changed according to widths of the low concentration region or the offset region.

Next, another resist for covering the p-channel TFT region is formed and is doped with impurity elements imparting n-type conductivity (typically P or As) with the first conductive layer 3008 and the sidewalls 3020 and 3021 as masks at a high concentration (a third doping step). The third doping step is performed with a dosage of $1 \times 10^{13}$ to $5 \times 10^{15}/cm^2$ and an acceleration voltage of 60 to 100 keV. By the third doping step, through doping is performed through the gate insulating film 3006, thus a pair of n-type high concentration impurity regions are formed.

Through the aforementioned steps, first impurity regions 3014 and 3015, second impurity regions 3016 and 3017, third impurity regions 3018 and 3019, and fourth-impurity regions 3022 and 3023 are formed in each of the semiconductor layers 3003 to 3005.

The resist may be removed by ashing and the like and the impurity region may be thermally activated. For example, a silicon oxynitride film is formed in thickness of 50 nm and thermal treatment may be performed at a temperature of 550° C. for four hours in a nitrogen atmosphere. By forming a SiNx film containing hydrogen in thickness of 100 nm and performing thermal treatment at a temperature of 410° C. for one hour in a nitrogen atmosphere, defects in the crystalline semiconductor film can be improved. This, for example, can terminate dangling bonds in the crystalline silicon. Further, a silicon oxynitride film is formed in thickness of 60 nm as a cap insulating film for protecting TFTs. Other than this, a material that blocks alkaline metal, such as aluminum nitride, aluminum oxide, silicon nitride, and silicon oxide can be used for a cap insulating film for protecting the TFTs. By forming these insulating films, the top, bottom and a periphery portion of the TFTs can be covered with an insulating film that blocks alkaline metal. These insulating films are preferably provided since a function for preventing Na and the like that adversely affects the characteristics of the TFTs from entering the TFTs is included.

Next, a first interlayer film 3024 is formed over the TFT. For the first interlayer film 3024, heat resistant organic resin such as polyimide, acryl, polyamide, and siloxane, an inorganic material, and a low dielectric constant (low-k) material can be used. For a forming method, spin coating, dipping, spray coating, droplet discharging method (ink-jetting method, screen printing, offset printing and the like), doctor knife, roll coater, curtain coater, knife coater and the like can be employed according to the material. For the inorganic material, silicon oxide, silicon nitride, silicon oxynitride, PSG (phosphorus glass), BPSG (Boron-Doped Phosphosilicate Glass), alumina film and the like can be used. By stacking these insulating films, the first interlayer film 3024 may be formed.

Further, a second interlayer film 3025 may be formed over the first interlayer film 3024. For the second interlayer film 3025, a film containing carbon such as DLC (Diamond-Like Carbon) or carbon nitride (CN), or a silicon oxide film, a silicon nitride film, a silicon nitride oxide film and the like can be used. For a forming method, plasma CVD, atmospheric plasma CVD and the like can be used. Alternatively, photosensitive or non-photosensitive organic material such as polyimide, acryl, polyamide, resist, and benzocyclobutene or heat resistant organic resin such as siloxane may be used.

Note that according to a stress generated from a difference in coefficient of thermal expansion between the first interlayer film 3024 or the second interlayer film 3025 and a conductive material that forms a wiring to be formed later and the like, a filler may be mixed in the first interlayer film 3024 or the second interlayer film 3025 for preventing a peeling and crack of in these films.

Next, a contact hole is opened by etching after forming a resist, then electrodes 3026 to 3030 are formed. The gas used for etching for opening the contact hole is a mixture gas of $CHF_3$ and He, however, the invention is not limited to this. Here, the electrodes 3026 to 3030 connected to the TFT have a five-layer structure in which Ti, Ti, Al—Si, Ti, and TiN are stacked sequentially and is formed by sputtering.

By mixing silicon in an Al layer, hillock can be prevented from generating in resist baking at a time of patterning. Moreover, about 0.5% of Cu may be mixed instead of Si. Further, by sandwiching an Al—Si layer with Ti and TiN, hillock resistance can be further improved. Note that it is preferable to use the aforementioned hard mask formed from SiON and the like in patterning. Note that the material and the forming method of the electrode are not limited to these, and the material used for the gate electrode may be employed as well.

Figure 5:
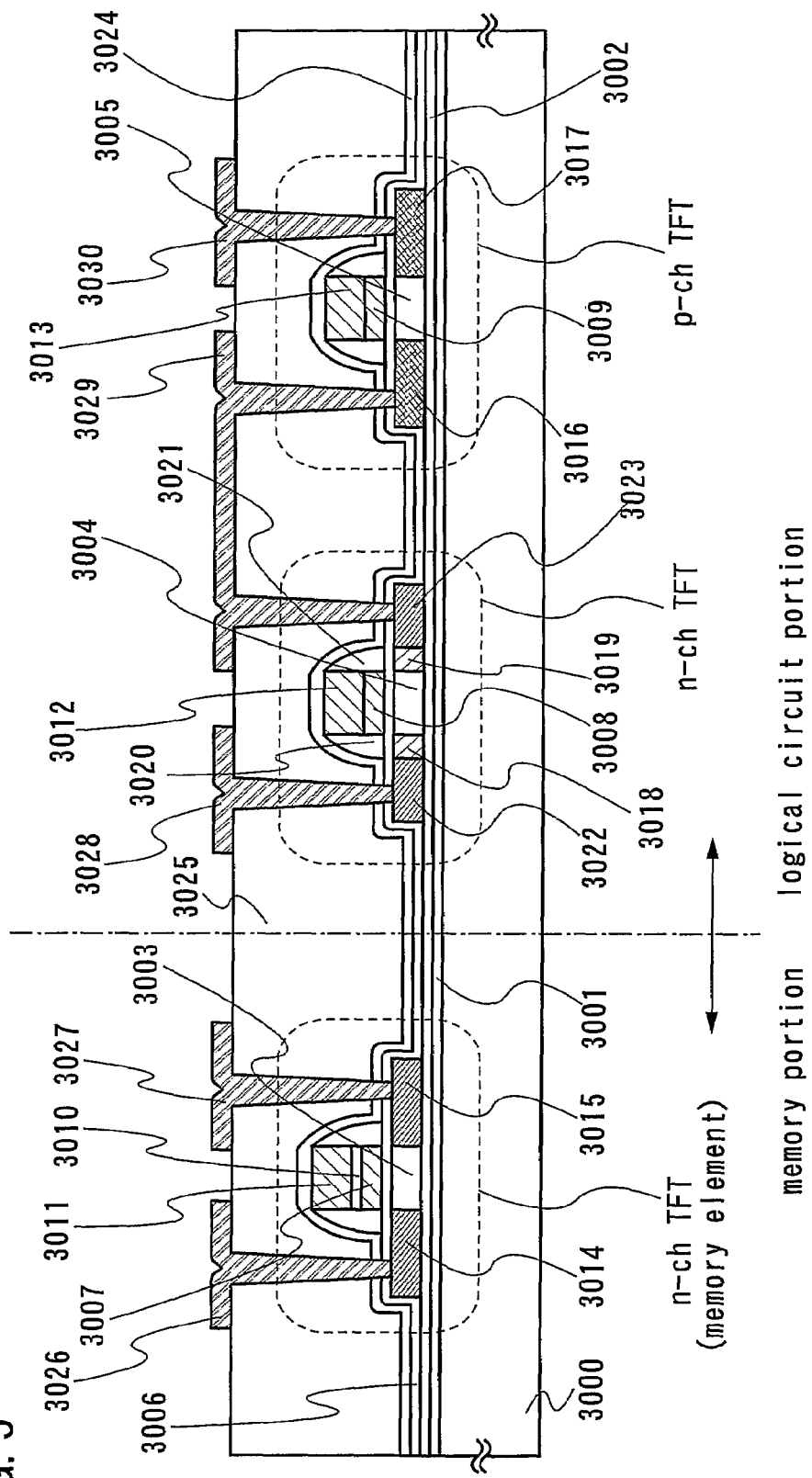
FIG. 5 is a diagram showing a manufacturing process of a TFT on an insulating substrate according to the invention.

As described above, a memory portion having an n-channel type memory element having a floating gate, and a logic circuit portion having an n-channel memory element and a p-channel TFT having a single drain structure as shown in FIG. 5 can be formed over the same substrate. The TFT formed by this method can have high characteristics. Specifically, an S value (Subthreshold value) is 0.35 or less, or more preferably 0.25 to 0.09 V/dec. Further, the carrier mobility is 10 $cm^2$/V·sec or more. In this embodiment, a top gate structure is employed, however, a bottom gate structure (an inverted staggered structure) may be employed as well. According to a condition of an impurity region formed in the n-channel TFT, a third doping step may be performed without forming the sidewalls.

Note that a base insulating film material, an interlayer insulating film material, and a wiring material are mainly provided in a region where a thin film active element portion such as a TFT is not provided. It is preferable that such a region occupy 50% or more, or preferably 70 to 99% of the whole thin film integrated circuit device. Accordingly, an IDF chip can be easily bent and a completed product such as an ID label can be handled easily. In this case, it is preferable that an island semiconductor region (island) of an active element including a TFT portion occupy 1 to 30% or more preferably 5 to 15% of the whole thin film integrated circuit device. This embodiment can be freely implemented in combination with other embodiments.

Embodiment 4

In this embodiment, description is made with reference to FIGS. 10 and 11 on a manufacturing method of an ID chip including a memory portion and a logic circuit portion and transferring it to a flexible substrate. Note that an n-channel memory element having a floating gate, an n-channel TFT, and a p-channel TFT are taken as examples, however, the semiconductor element included in the memory portion and the logic circuit portion in the invention are not limited to these. This manufacturing method is only an example and does not limit a manufacturing method on the insulating substrate.

A peeling layer 4000 is formed over the insulating substrate 3000. The peeling layer 4000 can be formed of a layer containing silicon as a main component, such as amorphous silicon, polycrystalline silicon, single crystalline silicon, semi-amorphous silicon (also referred to as microcrystalline silicon). The peeling layer 4000 can be formed by sputtering, plasma CVD and the like. In this embodiment, amorphous silicon is formed by sputtering in thickness of about 500 nm and used as the peeling layer 4000.

Next, the memory portion and the logic circuit portion as shown in FIG. 5 are formed according to the steps shown in Embodiment 2.

Next, a third interlayer insulating film 4001 is formed over the second interlayer film 3025 and pads 4004 to 4005 are formed. The pads 4004 to 4005 can be formed by using a conductive material containing one or a plurality of metals such as Ag, Au, Cu, Pd, Cr, Mo, Ti, Ta, W, and Al and metal compounds thereof.

Then, a protective layer 4006 is formed over the third interlayer insulating films 4001 so as to cover the pads 4004 to 4005. The protective layer 4006 is formed from a material that can protect the pads 4004 to 4005 when removing the peeling layer 4005 by etching. For example, epoxy, acrylate, or silicon resin that are soluble to water or alcohols is applied on the whole surface to form the protective layer 4006 (see FIG. 10A).

As show in FIG. 10B, a groove 4007 for separating the peeling layer 4000 is formed. The groove 4007 is formed so as to expose the peeling layer 4000. The groove 4007 can be formed by etching, dicing, scribing and the like.

As shown in FIG. 11A, the peeling layer 4000 is removed by etching. In this embodiment, halogenated fluoride is used as an etching gas that is brought in from the groove 4007. In this embodiment, etching is performed by using, for example, $ClF_3$ (Chlorine Trifluoride) at a temperature of 350° C., a flow rate of 300 sccm, a pressure of 800 Pa, and for three hours. Also, a gas obtained by mixing nitrogen into $ClF_3$ gas may be used as well. By using halogenated fluoride such as $ClF_3$, the peeling layer 4000 is selectively etched and the insulating substrate 3000 can be peeled off. Note that the halogenated fluoride may be a gas or liquid.

As shown in FIG. 11B, the memory portion and the logic circuit portion that are peeled off are stuck to a support base 4009 by using an adhesive 4008. A material that can stick the support base 4009 and the base film 3001 is used for the adhesive 4008. For the adhesive 4008, for example, various curable adhesives such as a reactive curable adhesive, a thermally curable adhesive, an optically curable adhesive such as an ultraviolet ray curable adhesive, and an anaerobic adhesive can be used.

For the support base 4009, an organic material such as paper and plastic that are flexible can be used. Alternatively, a flexible inorganic material may be used as well. It is preferable that the support base 4009 have high heat conductivity of about 2 to 30 W/mK for dispersing heat generated in the integrated circuit.

For peeling the integrated circuit of the memory portion and the logic circuit portion off the insulating substrate 3000, various methods can be used as well as the method where a silicon film is etched as described in this embodiment. For example, by providing a metal oxide film between a highly heat resistant substrate and an integrated circuit, the metal oxide film is made fragile, thus the integrated circuit can be peeled off. Also, by destroying the peeling layer by irradiating laser light, the integrated circuit can be peeled off the substrate. Moreover, the substrate on which the integrated circuit is formed can be peeled off mechanically or by etching using solution or gas.

In the case where a surface of an object is curved and a support base of an ID chip stuck to the curved surface is bent so as to have a curve drawn by a movement of a generating line such as a conical surface and a cylindrical surface, it is preferable to align a direction of the generating line and a direction that carriers of a TFT move. By the aforementioned structure, it can be suppressed that the characteristics of a TFT are affected even when the support base is bent. The island semiconductor film occupying an 1 to 30% of the area in the integrated circuit, it can be further suppressed that the characteristics of a TFT are affected even when the support base is affected. This embodiment can be freely implemented in combination with other embodiments.

Embodiment 5

In this embodiment, a structure of a memory element used for a memory cell is described with reference to FIGS. 12A, 12B, and 13. In the aforementioned embodiment mode, the memory element having the floating gate is described as the memory element, however, a MNOS memory element, a MONOS memory element, a memory element having microcrystalline silicon (hereinafter referred to as microcrystalline Si) can be used in this invention.

Figure 12A:
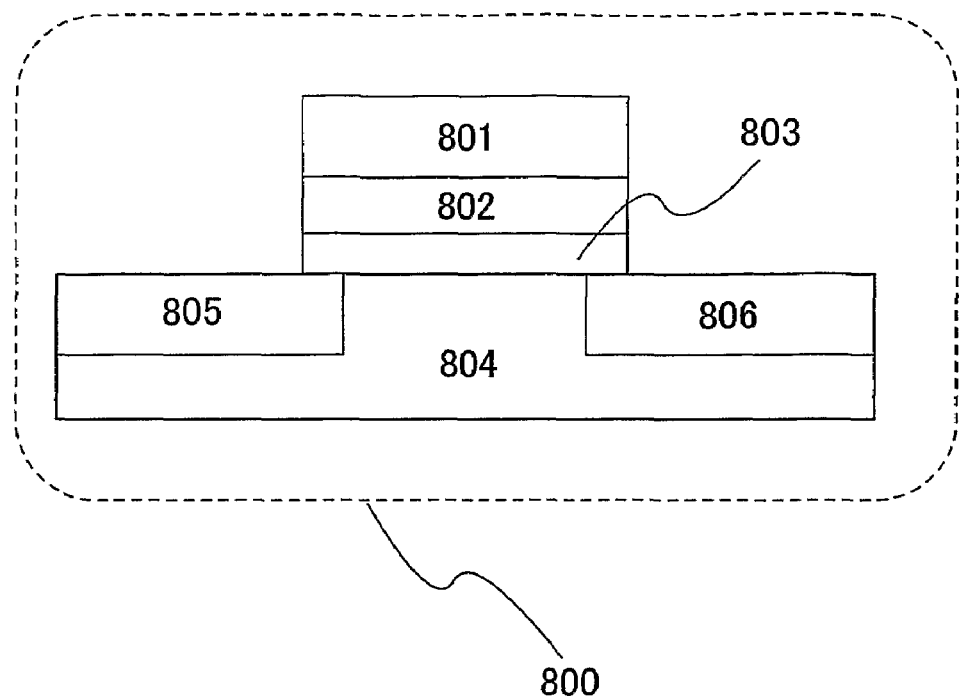
FIGS. 12A and 12B are sectional views of MNOS/MONOS memory elements respectively.
Figure 12B:
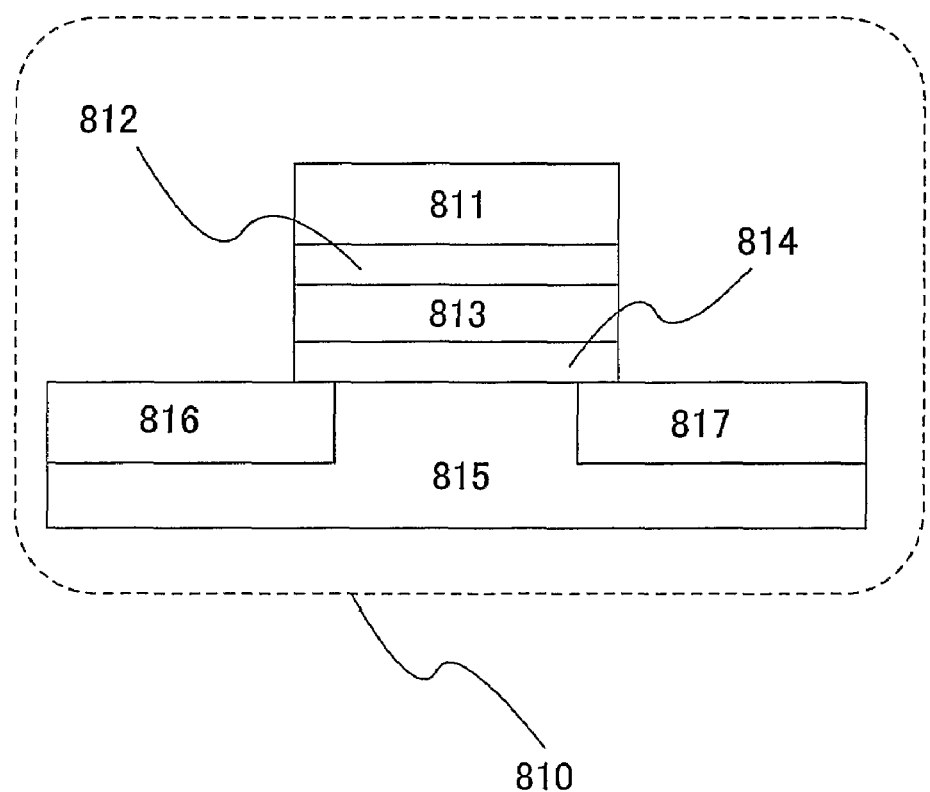

A MNOS memory element 800 has a structure that a gate electrode 801, a nitride film 802, an oxide film 803, and a substrate 804 are stacked in this order from the top (see FIG. 12A). The substrate 804 is a silicon substrate having a source region 805 and a drain region 806 doped with impurity elements and has one conductivity type. A MONOS memory element 810 has a structure that a gate electrode 811, a first oxide film 812, a nitride film 813, a second oxide film 814, and a substrate 815 are stacked in this order from the top (see FIG. 12B). The substrate 815 is a silicon substrate having a source region 816 and a drain region 817 doped with impurity elements and has one conductivity type.

Figure 13:
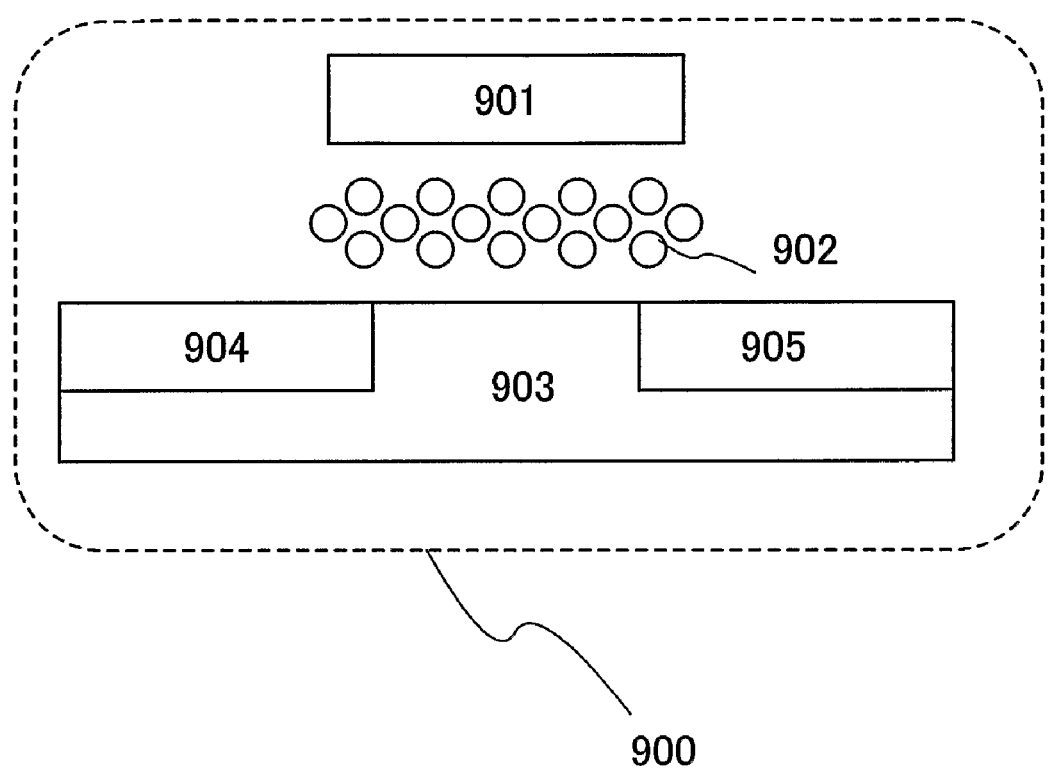
FIG. 13 is a sectional view of a memory element using microcrystalline Si.

A memory element 900 containing microcrystalline Si as a charge accumulating layer has a structure that a gate electrode 901, a microcrystalline Si layer 902, and a substrate 903 are stacked in this order from the top (see FIG. 13). The substrate 903 is a silicon substrate having a source region 904 and a drain region 905 doped with impurity elements and has one conductivity type.

In a MNOS memory element, a MONOS memory element, and a memory element using microcrystalline Si, operations at the time of writing and reading can be performed similarly to a memory element having a floating gate. That is, the writing operation is performed by using hot electrons while the reading operation is performed by using different threshold voltages of memory elements.

The MNOS memory element 800 and the MONOS memory element 810, which accumulate charges in trapping centers of the silicon nitride films, have different modes of charge accumulation from a conductive floating gate and is not easily affected by a local defect of the gate insulating film. That is, a memory element having a floating gate loses data by a leak of charge caused by only a local deterioration of the gate insulating film, while the MNOS memory element 800 and the MONOS memory element 810 loses charges only in a portion that is deteriorated, thus data is held. Similarly, the memory element 900 containing microcrystalline Si that functions as a discrete trapping center, is not easily affected by a local defect of the gate insulating film either. This embodiment can be freely implemented in combination with other embodiments.

Embodiment 6

In this embodiment, description is made with reference to FIGS. 14A to 14C, 15A to 15C, and 17A and 17B on the case where an OTP nonvolatile memory according to the invention is applied to various objects for one purpose of achieving security such as prevention of stealing and forgery, and an ID chip using a flexible substrate (hereinafter referred to as an IDF chip) is mounted.

Figure 14A:
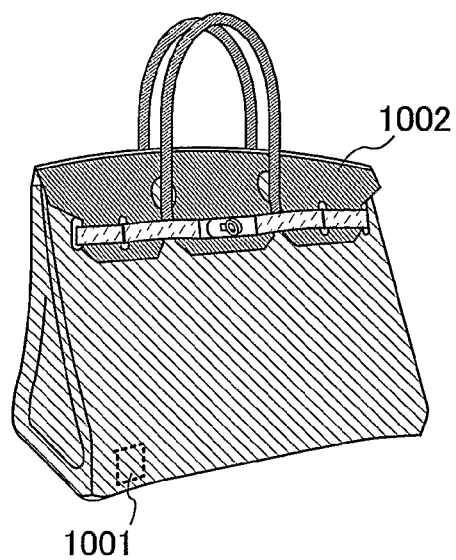
FIGS. 14A to 14C are diagrams showing applications of the nonvolatile memory of the invention.

For preventing stealing, an IDF chip is mounted on a bag, for example. As shown in FIG. 14A, an IDF chip 1001 is mounted on a bag 1002. For example, the IDF chip 1001 can be mounted on a portion of the bottom or side surface of the bag 1002. As the IDF chip 1001 is quite thin and small, it can be mounted without degrading the design of the bag 1002. In addition, as the IDF chip 1001 transmits light, a robber cannot easily figure out that the IDF chip 1001 is mounted. Therefore, it is unlikely that the IDF chip 1001 is taken off by a robber.

When such a bag mounting an IDF chip is stolen, data on a current position of the bag can be obtained by using, for example, a GPS (Global Positioning System). Note that a GPS is a positioning system based on the time difference between local time and the time the satellite signals were sent.

The current positions of the things left behind or lost as well as stolen things can be obtained by using a GPS.

In addition to a bag, an IDF chip can be mounted on a vehicle such as a car and a bicycle, a watch and accessories.

Figure 14B:
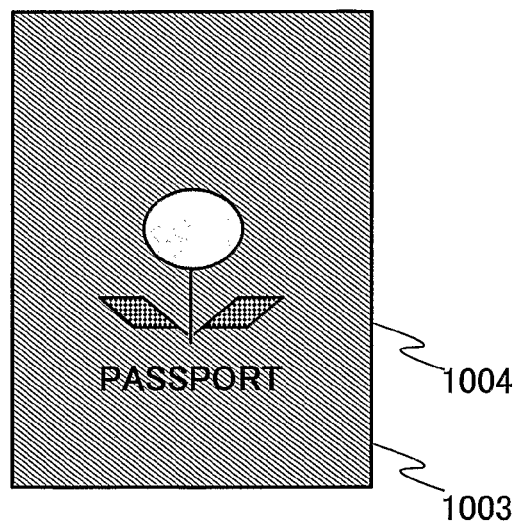

As an example of preventing forgery, description is made with reference to FIG. 14B on the case of mounting an IDF chip on a passport, a driver's license and the like.

FIG. 14B shows a passport 1004 on which an IDF chip 1003 is mounted. In FIG. 14B, the IDF chip is mounted on a cover of the passport, however, it may be mounted on other pages as well. Also, the IDF chip may be mounted on the cover since it transmits light. The IDF chip may be mounted inside the cover by sandwiching the IDF chip with a material of the cover and the like.

Figure 14C:
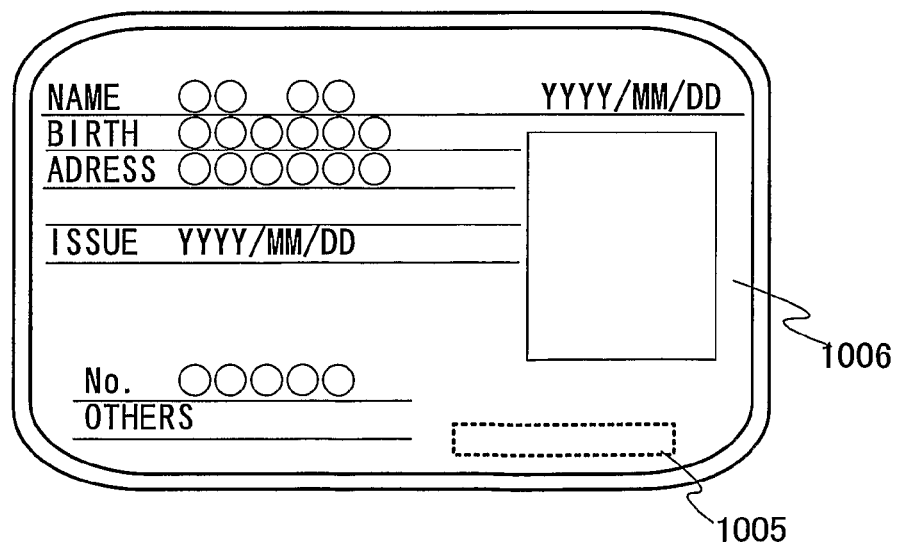

FIG. 14C shows a driver's license 1006 in which an IDF chip 1005 is incorporated. The IDF chip may be mounted on a printed surface of the driver's license 1006 since it transmits light. For example, the IDF chip 1005 is mounted on the printed surface of the driver's license 1006 and sandwiched by providing a pair of heat curable resin or resin film on the top and bottom thereof and thermally bonded to cover the driver's license incorporated with the IDF chip 1005. The IDF chip 1005 may be sandwiched by the material of the driver's license 1006 to be incorporated inside.

By mounting an IDF chip on the aforementioned objects, forgery can be prevented. Moreover, forgery can be prevented by mounting an IDF chip on the aforementioned bag as well. An IDF chip that is quite thin and small does not degrade the design of the passport, the driver's license and the like. An IDF chip may be mounted on the cover since it transmits light.

By using an IDF chip, management of passports, driver's licenses and the like can be simplified. As data is not directly written in the passport, the driver's license and the like, but stored in an IDF chip, privacy can be protected.

An IDF chip is quite thin and small, and also can be flexible, therefore, it can be mounted on a sheet object. For example, FIG. 15A-*shows* the case of mounting an IDF chip on paper money as a sheet object.

Figure 15A:
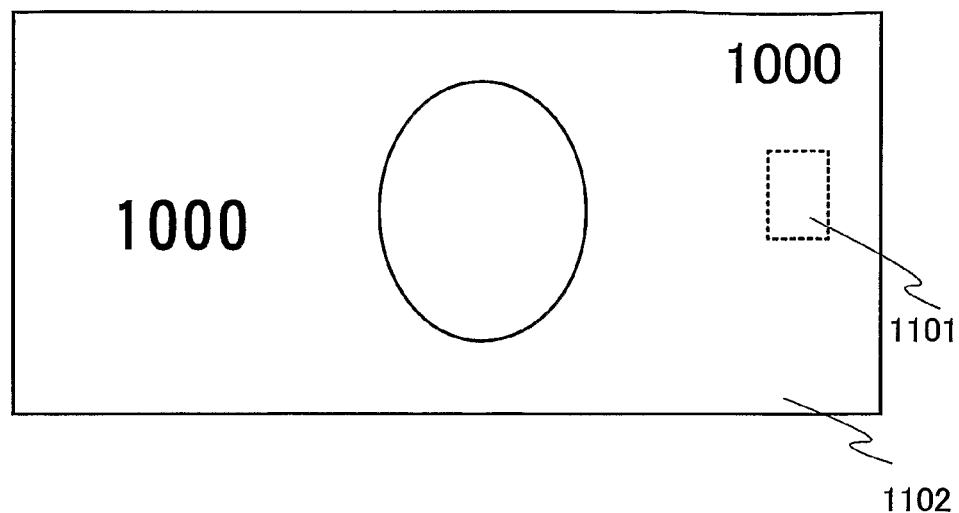
FIGS. 15A to 15C are views showing applications of the nonvolatile memory of the invention.

As shown in FIG. 15A, an IDF chip 1101 is mounted on paper money 1102. FIG. 15A shows a mode of mounting the IDF chip 1101 inside the paper money 1102, however, it may be exposed on the cover.

Further, the paper money 1102 may be printed by using an ink containing the IDF chip 1101. Also, when mixing a material of the paper money 1102 and chemicals, the IDF chips 1101 may be scattered to form paper money incorporated with a plurality of IDF chips 1101. Since an IDF chip can be manufactured at low cost, little cost is added to the cost of the paper money itself even when the plurality of IDF chips are incorporated.

Also, an IDF chip may be incorporated in securities other than paper money, such as a stock, a check, or a coin.

Such a sheet object is frequently bent, therefore, a bending stress applied to the IDF chip is required to be taken into consideration.

Figure 15B:
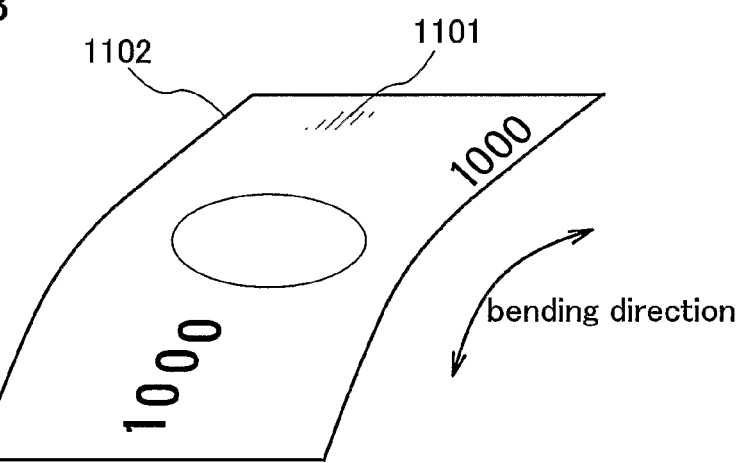

FIG. 15B shows a mode that the paper money incorporated with the IDF chip is bent in a direction of an arrow. Generally, a sheet object easily bends or is bent in a longitudinal direction, therefore, the case of bending in a longitudinal direction is described.

Figure 15C:
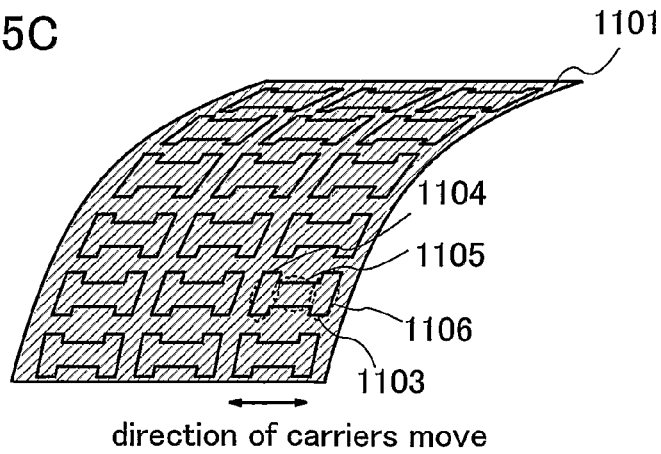

A state of an IDF chip at this time is shown in FIG. 15C. The IDF chip 1101 includes a plurality of thin film transistors 1103 each of which includes a source region 1104, a channel forming region 1105, and a drain region 1106. It is preferable that such an IDF chip be disposed so that the direction of the arrow (bending direction) becomes perpendicular to a direction that carriers move. That is, the source region 1104, the channel forming region 1105, and the drain region 1106 are disposed so as to be perpendicular to the bending direction. As a result, the thin film transistor can be prevented from being broken and peeled off by the bending stress.

In the case of using a crystalline semiconductor film using laser irradiation for the thin film transistor 1103, the laser scanning direction is set perpendicular to the bending direction as well. For example, it is preferable to set a long axis of the laser scanning direction to be perpendicular to the bending direction.

By bending an IDF chip in such a direction, the IDF chip, in particular the thin film transistor is not broken and crystal grain boundaries that exist in the direction that carriers move can considerably be decreased. As a result, electronic characteristics, in particular mobility of the thin film transistor can be improved.

In addition, when a patterned semiconductor film occupies 1 to 30% of an area of the IDF chip, the thin film transistor can be prevented from being broken and peeled off by the bending stress.

Figure 17A:
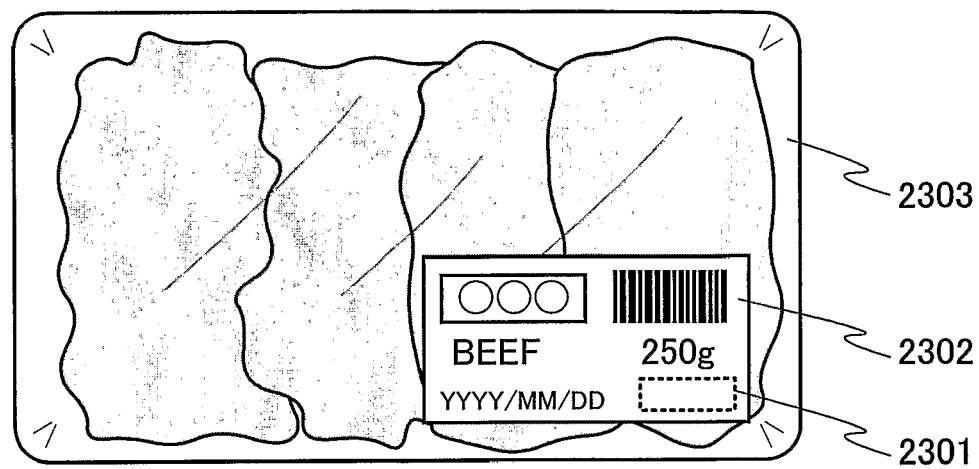
FIGS. 17A and 17B are views showing applications of the nonvolatile memory of the invention.
Figure 17B:
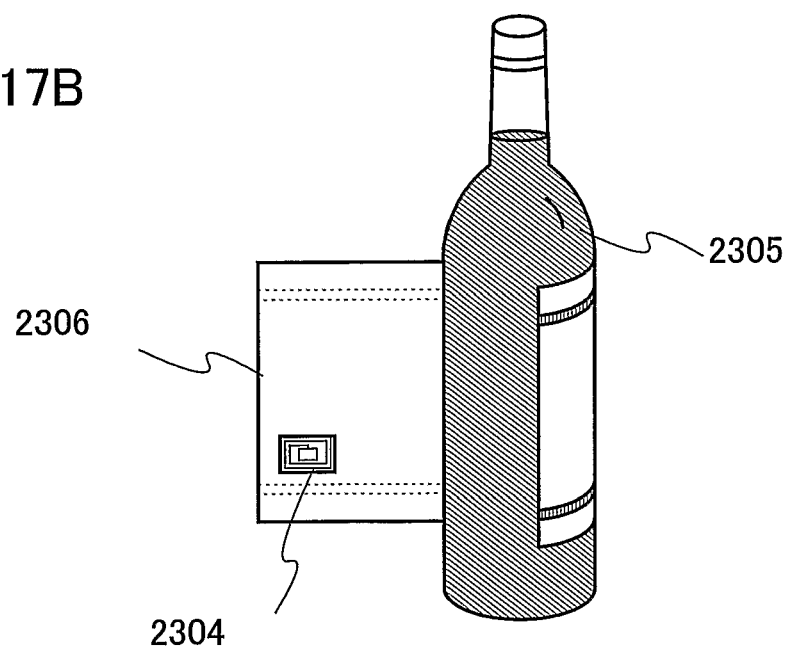

Now, description is made with reference to FIGS. 17A and 17B on the case of mounting an IDF chip on a product such as groceries for safety management.

FIG. 17A shows a pack of meat 2303 to which a label 2302 mounting an IDF chip 2301 is stuck. The IDF chip 2301 may be mounted on the surface of the label 2302 or incorporated therein. For fresh food such as vegetables, the IDF chip 2301 may be mounted on a wrapping film for wrapping them, The IDF chip 2301 can store data on product such as a place of production, a producer, a pack date, and an expiration date, for example. In this manner, it is very desirable to use an OTP type nonvolatile memory according to the invention for storing data that is not required to be reprogrammed.

In order to carry out safety management of food, it is essential to provide information on the conditions of plants and animals before processed. Therefore, it is preferable that data on plants and animals be obtained by a reader by embedding an IDF chip to/in the plants and animals. The data on the plants and animals includes breeding areas, feed, breeders, infection of contagious diseases and the like.

Further, when IDF chips store the product price, payment of products can be made in shorter time and more simply than using a conventional barcode. That is, products mounting the IDF chips can be paid all at once. When reading out a plurality of IDF chips at a time, the reader device is required to be have an anticollision function.

Depending on a communication distance with the IDF chip, payment can be made even with a long distance between the register and the product. Further, the IDF can be used for preventing shoplifting as well.

In addition, the IDF chip can be used in combination with a barcode, a magnetic tape or other data mediums. For example, it is preferable that basic data that is not required to be reprogrammed be stored in the IDF chip while optional data such as a discount price or a bargain price that is required to be reprogrammed be stored in the barcode. This is because the barcode can be modified in data more simply, unlike the IDF chip.

By mounting the IDF chip in this manner, larger amount of product data can be provided for consumers. Therefore, consumers can purchase the products with a safe conscience.

Now, the case of mounting an IDF chip on a product such as a beer bottle for distribution management is described with reference to FIG. 17B. As shown in FIG. 17B, an IDF chip 2304 is mounted on a bottle 2305. For example, the IDF chip 2304 can be mounted by using a label 2306.

The IDF chip 2304 can store data such as a date manufactured, a place of manufacture, and ingredients. In this manner, it is very desirable to use an OTP type nonvolatile memory according to the invention for storing data that is not required to be reprogrammed.

It is preferable to construct a system such that when data on a purchased product is transmitted to a distribution management center through a network from a receiver, a writing device, a personal computer or the like that controls the writing device calculates the delivery address and date based on the transmitted data, thereby storing the data into the IDF chip 2304.

In addition, delivery of products is sometimes carried out per case, therefore, an IDF chip may be mounted per case or several cases to store the individual data of products.

By mounting an IDF chip on each of beverages that are to be delivered to a plurality of destinations, time required for a manual data input or input mistake can be reduced. Further, since the employment cost that costs the most in distribution management can be reduced, mounting of the IDF chip realizes low-cost distribution management with few mistakes.

By mounting the IDF chip in this manner, a larger amount of product data can be provided for the consumers. Therefore, consumers can purchase the products with a safe conscience.

Note that the examples shown in this embodiment are only examples and the invention is not limited to these applications. This embodiment can be freely implemented in combination with other embodiment modes and embodiments.

Embodiment 7

In this embodiment, description is made on a product mounting an IDF chip including the OTP type nonvolatile memory of the invention, and a manufacturing apparatus (manufacturing robot) that is controlled based on the data of the IDF chip in order to carry out manufacturing control.

In recent years, more consumers intend to purchase original products. In the case of manufacturing such original products, the production line is constructed so as to accommodate the original data of the products. For example, on the production line of automobiles that is capable of selecting painting colors freely, an IDF chip may be mounted on a part of the automobile, and a painting device is controlled based on the data stored in the IDF chip, whereby an automobile of the original color can be manufactured.

By mounting the ID chip, the orders of automobiles or the number of automobiles of the same color that are thrown in the production line is not required to be controlled beforehand. Thus, a program for controlling the painting device in accordance with the order or the number of automobiles is not required. In addition, the manufacturing device can operate individually based on the data of the IDF chip mounted on the automobile.

In this manner, the IDF chip can be used in various places. According to data stored in the IDF chip, data on the product can be obtained, based on which the manufacturing apparatus can be controlled.

The present application is based on Japanese Priority Applications No. 2004-033075 and No. 2004-033081 filed on Feb. 10, 2004 with the Japan Patent Office, the entire contents of which are hereby incorporated by reference.

The invention claimed is:

1. A nonvolatile memory comprising:
a memory cell array comprising a plurality of memory cells over a substrate, each memory cell comprising at least first and second memory elements,
wherein each of first and second memory elements has a low state and a high state regarding electric characteristics and can transit only from the low state to the high state by applying at least a voltage or a current, and
wherein the memory cell stores 1-bit data by using a (L, H) state that the first memory element is in the low state and the second memory element is in the high state or a (H, L) state that the first memory element is in the high state and the second memory element is in the low state.

2. A nonvolatile memory comprising:
a memory cell array comprising a plurality of memory cells over a substrate, each memory cell comprising at least first and second memory elements,
wherein each of first and second memory elements has a low state and a high state regarding electric characteristics and can transit only from the low state to the high state by applying at least a voltage or a current,
wherein the memory cell stores 1-bit data by using a (L, H) state that the first memory element is in the low state and the second memory element is in the high state or a (H, L) state that the first memory element is in the high state and the second memory element is in the low state, and
wherein the (L, H) state and the (H, L) state cannot be transited to each other by applying a voltage or a current to at least one of the first memory element and the second memory element.

3. A nonvolatile memory comprising:
a memory cell array comprising a plurality of memory cells over a substrate, each memory cell comprising at least first and second memory elements,
wherein each of first and second memory elements has a low state and a high state regarding threshold voltage and can transit only from the low state to the high state by applying a voltage, and
wherein the memory cell stores 1-bit data by using a (L, H) state that the first memory element is in the low state and the second memory element is in the high state or a (H, L) state that the first memory element is in the high state and the second memory element is in the low state.

4. A nonvolatile memory comprising:
a memory cell array comprising a plurality of memory cells over a substrate, each memory cell comprising at least first and second memory elements,
wherein each of first and second memory elements has a low state and a high state regarding threshold voltage and can transit only from the low state to the high state by applying a voltage,
wherein the memory cell stores 1-bit data by using a (L, H) state that the first memory element is in the low state and the second memory element is in the high state or a (H, L) state that the first memory element is in the high state and the second memory element is in the low state, and
wherein the (L, H) state and the (H, L) state cannot be transited to each other by applying a voltage to at least one of the first memory element and the second memory element.

5. A nonvolatile memory comprising:
a memory cell array comprising a plurality of memory cells over a substrate, each memory cell comprising at least first and second memory elements,
wherein each of first and second memory elements has a low state and a high state regarding resistance value and can transit only from the low state to the high state by applying a current, and
wherein the memory cell stores 1-bit data by using a (L, H) state that the first memory element is in the low state and the second memory element is in the high state or a (H, L) state that the first memory element is in the high state and the second memory element is in the low state.

6. A nonvolatile memory comprising:
a memory cell array comprising a plurality of memory cells over a substrate, each memory cell comprising at least first and second memory elements,
wherein each of first and second memory elements has a low state and a high state regarding resistance value and can transit only from the low state to the high state by applying a current,
wherein the memory cell stores 1-bit data by using a (L, H) state that the first memory element is in the low state and the second memory element is in the high state or a (H, L) state that the first memory element is in the high state and the second memory element is in the low state, and
wherein the (L, H) state and the (H, L) state cannot be transited to each other by applying a current to at least one of the first memory element and the second memory element.

7. The nonvolatile memory according to any one of claims 1, 2, 3, 4, 5, and 6 further comprising a unit for outputting a signal for determining if the memory cell stores data or not is provided.

8. The nonvolatile memory according to claim 3, wherein each of the first and second memory elements has a charge accumulating layer comprising at least one of a polycrystalline silicon film, a microcrystalline silicon film, a metal film, a microcrystalline metal film, and a nitride film.

9. An IC card incorporated with the nonvolatile memory according to any one of claims 1, 2, 3, 4, 5, and 6.

10. An ID card incorporated with the nonvolatile memory according to any one of claims 1, 2, 3, 4, 5, and 6.

11. An ID tag incorporated with the nonvolatile memory according to any one of claims 1, 2, 3, 4, 5, and 6.

* * * * *